(12) United States Patent
Tang

(10) Patent No.: US 11,735,240 B2
(45) Date of Patent: Aug. 22, 2023

(54) STAIRCASE BRIDGE STRUCTURES FOR WORD LINE CONTACTS IN THREE-DIMENSIONAL MEMORY

(71) Applicant: Yangtze Memory Technologies Co., Ltd., Hubei (CN)

(72) Inventor: Qiang Tang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 63 days.

(21) Appl. No.: 17/017,237

(22) Filed: Sep. 10, 2020

(65) Prior Publication Data

US 2022/0028440 A1 Jan. 27, 2022

Related U.S. Application Data

(63) Continuation of application No. PCT/CN2020/104955, filed on Jul. 27, 2020.

(51) Int. Cl.
*H10B 43/10* (2023.01)
*H10B 43/27* (2023.01)
(Continued)

(52) U.S. Cl.
CPC .......... *G11C 8/14* (2013.01); *H01L 29/40117* (2019.08); *H01L 29/42344* (2013.01);
(Continued)

(58) Field of Classification Search
CPC ...... H01L 27/115–11597; H10B 69/00; H10B 53/00; H10B 53/10; H10B 53/20;
(Continued)

(56) References Cited

U.S. PATENT DOCUMENTS 8,704,288 B2 4/2014 Lee et al.
8,748,970 B1 * 6/2014 Lee ................... H01L 27/11575
257/324

(Continued)

FOREIGN PATENT DOCUMENTS

| CN | 102468283 A | 5/2012 |
| CN | 110447103 A | 11/2019 |
| TW | 202025284 A | 7/2020 |

OTHER PUBLICATIONS

International Search Report of the International Searching Authority directed to related International Patent Application No. PCT/CN2020/104955, dated Apr. 26, 2021; 5 pages.

*Primary Examiner* — Didarul A Mazumder
*Assistant Examiner* — Gustavo G Ramallo
(74) *Attorney, Agent, or Firm* — Sterne, Kessler, Goldstein & Fox P.L.L.C.

(57) ABSTRACT

Embodiments of three-dimensional (3D) memory devices and methods for forming the 3D memory devices are disclosed. In an example, the 3D memory device includes a film stack having a plurality of conductive and dielectric layer pairs vertically stacked on a substrate. Each conductive and dielectric layer pair includes a dielectric layer and a conductive layer. The 3D memory device also includes a staircase region having a first and a second staircase structure formed in the film stack, where the first and second staircase structures each extends laterally in a first direction and includes the plurality of conductive and dielectric layer pairs. The staircase region further includes a staircase bridge connecting the first and second staircase structures.

16 Claims, 25 Drawing Sheets

(51) Int. Cl.
*H10B 43/35* (2023.01)
*G11C 8/14* (2006.01)
*H01L 21/28* (2006.01)
*H01L 29/423* (2006.01)

(52) U.S. Cl.
CPC ............ *H10B 43/10* (2023.02); *H10B 43/27* (2023.02); *H10B 43/35* (2023.02)

(58) Field of Classification Search
CPC ........ H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | |
|---|---|---|---|
| 10,269,817 B2 | 4/2019 | Ogawa et al. | |
| 2012/0224426 A1* | 9/2012 | Nam | H01L 27/11519 365/185.11 |
| 2017/0256551 A1* | 9/2017 | Lee | H01L 27/1157 |
| 2018/0286743 A1* | 10/2018 | Chang | H01L 23/53271 |
| 2018/0350825 A1* | 12/2018 | Ogawa | H01L 27/11582 |
| 2019/0139978 A1* | 5/2019 | Kim | H01L 27/11575 |
| 2020/0185410 A1 | 6/2020 | Xiao | |
| 2020/0194447 A1* | 6/2020 | Sun | H01L 27/11529 |
| 2021/0057442 A1* | 2/2021 | Zhang | H10B 43/27 |
| 2021/0296232 A1* | 9/2021 | Zhang | H01L 23/5226 |
| 2022/0051938 A1 | 2/2022 | Wu et al. | |

* cited by examiner

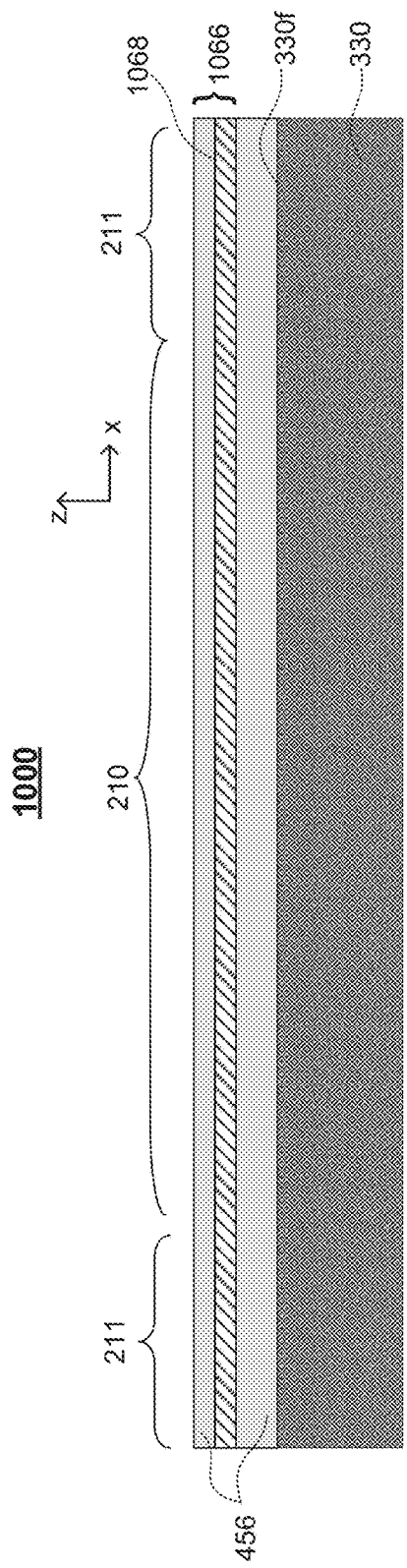
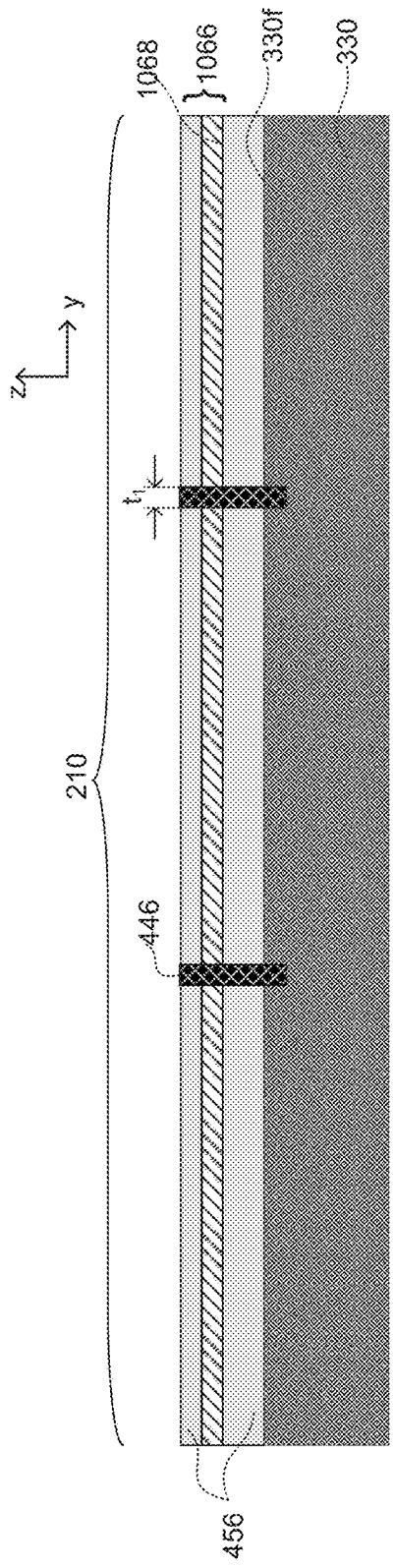
FIG. 10A
FIG. 10B

STAIRCASE BRIDGE STRUCTURES FOR WORD LINE CONTACTS IN THREE-DIMENSIONAL MEMORY

CROSS-REFERENCE TO RELATED APPLICATIONS AND INCORPORATION BY REFERENCE

This application claims priority to PCT/CN2020/104955 filed on Jul. 27, 2020, which is incorporated herein by reference in its entirety.

TECHNICAL FIELD

The present disclosure generally relates to the field of semiconductor technology, and more particularly, to a method for forming a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND memory, memory cells can be vertically stacked to increase storage capacity per unit area, where memory cells can be addressed from a shared word line. To access word lines of the vertically stacked memory cells, staircase structures can be formed at one or both edges of the memory array. However, to further increase storage capacity of a 3D NAND memory, the number of memory cells and the size of the memory array have been increased greatly. As a result, the distance between the memory cells in the middle of the memory array and the electrical connections at the end of word lines increases, leading to larger parasitic resistance and slower read/write speed. Thus, a need exists for improvement in the staircase structures in a 3D NAND memory to achieve higher storage density without sacrificing the performance.

BRIEF SUMMARY

Embodiments of a three-dimensional (3D) memory device and methods for forming the same are described in the present disclosure.

One aspect of the present disclosure provides a three-dimensional (3D) memory device. In an example, the 3D memory device includes a film stack having a plurality of conductive and dielectric layer pairs vertically stacked on a substrate. Each conductive and dielectric layer pair includes a dielectric layer and a conductive layer. The 3D memory device also includes a staircase region having a first and a second staircase structure formed in the film stack, where the first and second staircase structures each extends laterally in a first direction and includes the plurality of conductive and dielectric layer pairs. The staircase region further includes a staircase bridge connecting the first and second staircase structures.

In some embodiments, the staircase bridge includes the plurality of conductive and dielectric layer pairs. In some embodiments, the staircase bridge is configured to electrically connect the conductive layer in each conductive and dielectric layer pair of the first staircase structure with the conductive layer in a corresponding conductive and dielectric layer pair of the second staircase structure.

In some embodiments, the staircase bridge extends laterally in the first direction and has a width smaller than a width of the first and second staircase structures.

In some embodiments, the staircase bridge extends laterally in a second direction, perpendicular to the first direction, and has a first surface longer than a second surface opposite the first surface.

In some embodiments, the 3D memory device further includes a plurality of memory strings vertically penetrating through the film stack, the plurality of memory strings each having a core filling film, a channel layer surrounding the core filling film, and a memory film surrounding the channel layer.

In some embodiments, the plurality of memory strings are distributed on opposite sides of the first staircase region.

In some embodiments, the first and second staircase structures are symmetric to each other along the first direction.

In some embodiments, the 3D memory device also includes a plurality of contact structures, electrically connected with the conductive layers of the first and second staircase structures. In some embodiments, a first subset of the plurality of contact structures is formed on the conductive layers of the first staircase structure, and a second subset of the plurality of contact structures is formed on the conductive layers of the second staircase structure, where the second subset of the plurality of contact structures is different from the first subset of the plurality of contact structures.

In some embodiments, the first staircase region is in a center of a memory array of the 3D memory device. In some embodiments, the 3D memory device further includes one or more bottom select gate (BSG) cuts dividing the memory array into two or more sub-blocks, each sub-block comprising a sub-BSG. In some embodiments, the one or more BSG cuts penetrate vertically through one or more of the conductive and dielectric layer pairs at a bottom portion of the film stack.

In some embodiments, the 3D memory device also includes a second staircase region having a third staircase structure and a fourth staircase structure formed in the film stack. The third and fourth staircase structures extend laterally in the first direction. The 3D memory device further includes a second staircase bridge connecting the third and the fourth staircase structures. The first and the second staircase bridges are on opposite sides of the first and second staircase regions, respectively.

Another aspect of the disclosure provides a method for forming a three-dimensional (3D) memory device. The method includes disposing an alternating dielectric stack on a substrate, where the alternating dielectric stack includes a plurality of dielectric layer pairs. Each dielectric layer pair includes a first dielectric layer and a second dielectric layer different from the first dielectric layer. The method also includes forming a first dielectric staircase, a second dielectric staircase, and a dielectric bridge in the alternating dielectric stack, where the first and second dielectric staircases are connected by the dielectric bridge.

In some embodiments, the method further includes replacing the second dielectric layer in the alternating dielectric stack with a conductive layer to form a film stack of alternating conductive and dielectric layers.

In some embodiments, the method also includes forming a plurality of contact structures on the conductive layers of the film stack.

In some embodiments, the method further includes disposing the first and second dielectric layers on the substrate prior to disposing the alternating dielectric stack, and forming one or more bottom select gate (BSG) cuts extending vertically through the first and second dielectric layers into the substrate.

In some embodiments, the method also includes forming a plurality of memory strings vertically penetrating through the alternating dielectric stack, wherein the plurality of memory strings each includes a core filling film, a channel layer surrounding the core filling film, and a memory film surrounding the channel layer.

In some embodiments, the forming of the plurality of memory strings includes forming the plurality of memory strings on opposite sides of the first and second dielectric staircases.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 10A and 10B illustrate cross-sectional views a 3D memory structure at certain process step, according to some embodiments of the present disclosure.

Figure 1:
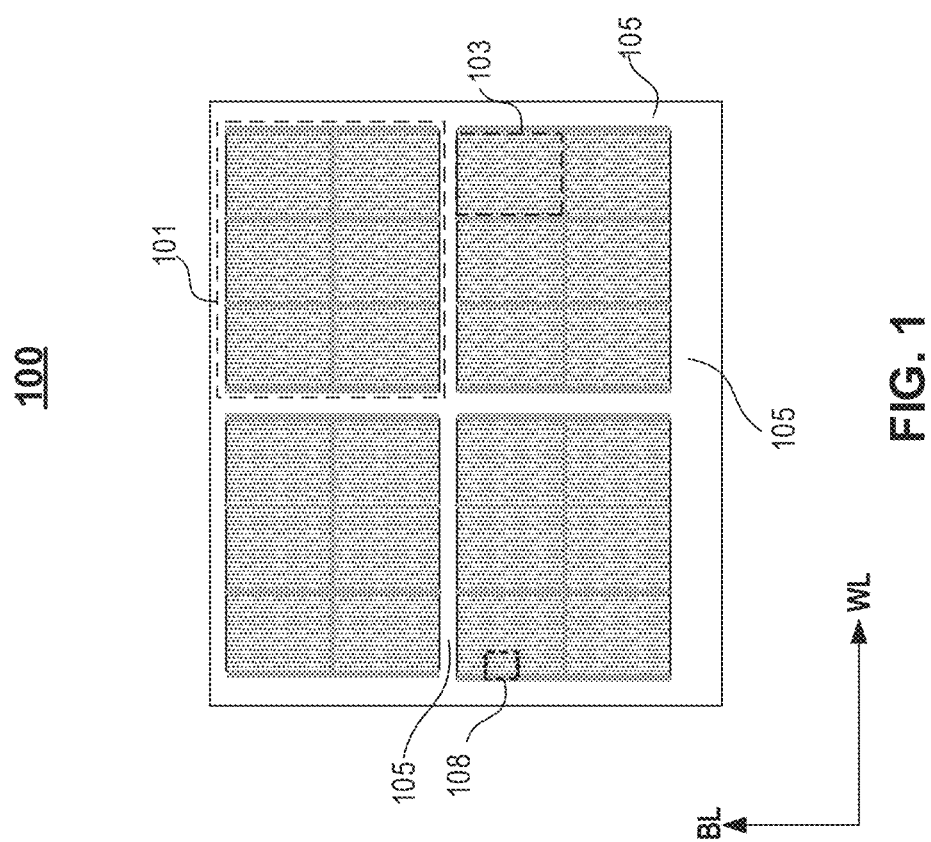
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
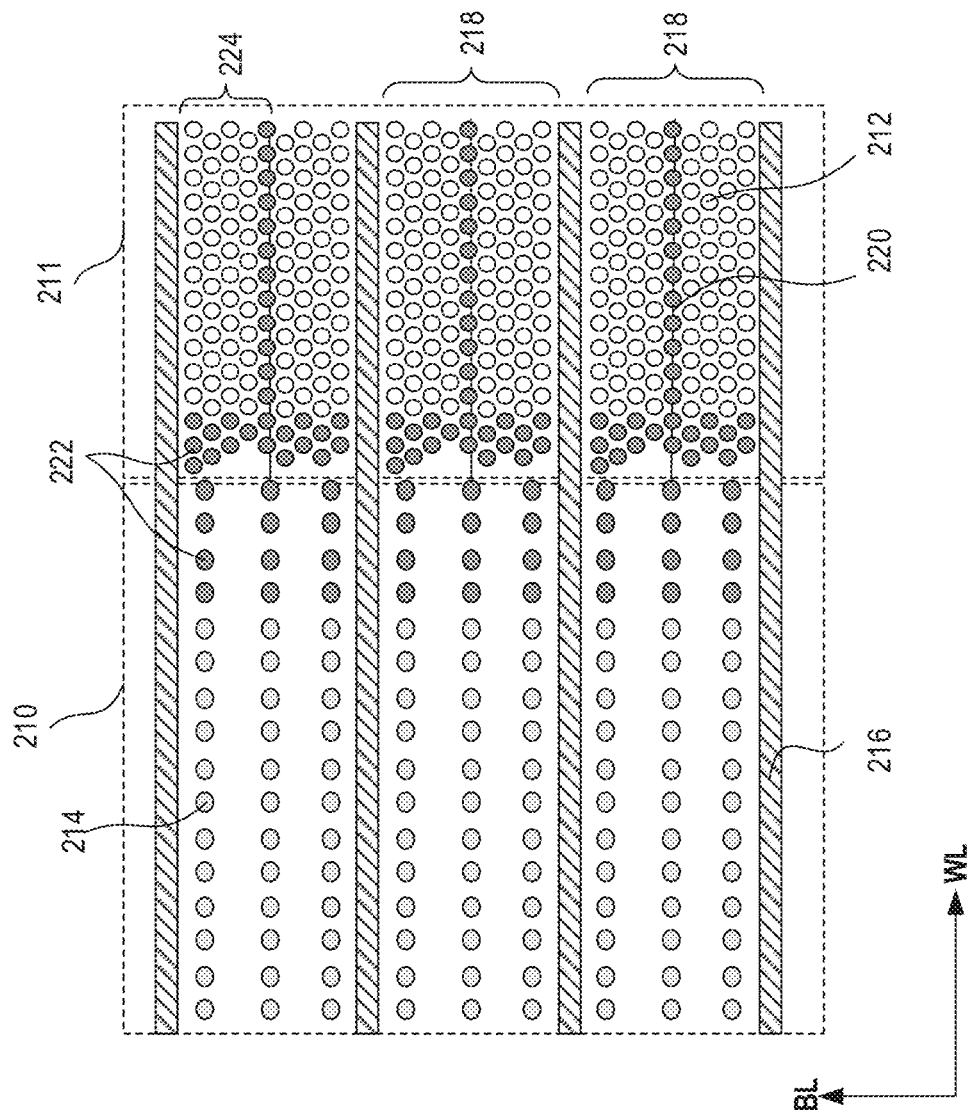
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure (see FIG. 3) and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
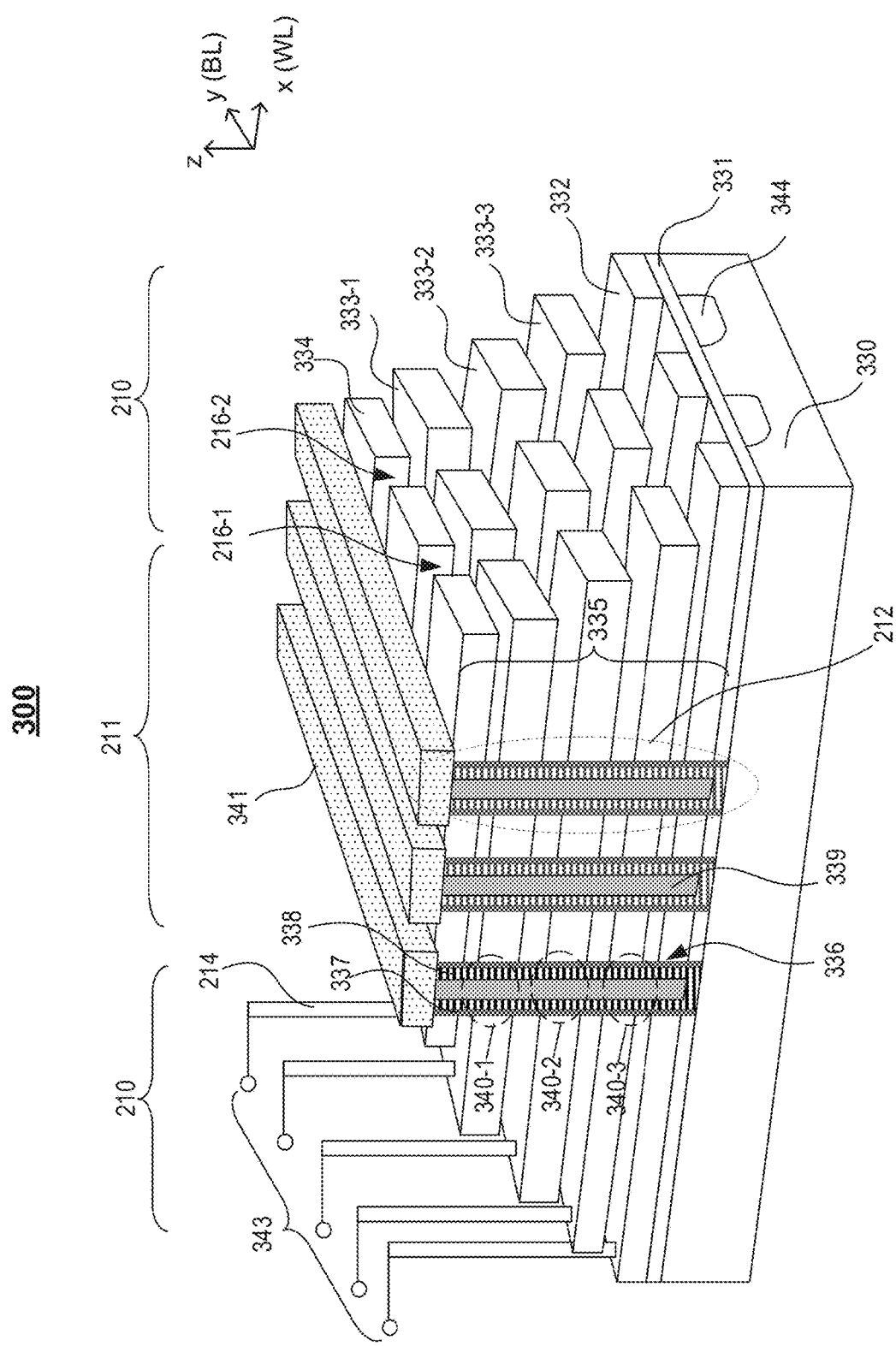
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. A portion of the channel layer 338 underneath the control gate 333 is also referred to as the channel of the memory cell 340. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact and dummy memory string. These structures are not shown in FIG. 3 for simplicity.

To pursue higher storage capacity in a 3D memory, the number of memory cells 340 and the dimensions of memory block 103 (in FIG. 1) or channel structure region 211 (in FIG. 3) have been increased greatly. As a result, the distance from the memory cells 340 in the middle of the memory block 103 or channel structure region 211 to the contact structures 214 at the end of word lines 333 also increases, leading to larger parasitic resistance and slower read/write speed. To resolve this issue, staircase structures can be formed in the middle of the memory block 103 (or channel structure region 211), where a set of contact structures 214 and metal interconnect lines 343 can be formed for each set of staircase structure. However, to form electrical connections between the word lines 333 located in the middle of the memory block 103 and word-liner driver circuits located in the peripheral region 105, layout of metal interconnect lines 343 is complicated and can induce routing congestion and increase manufacturing cost.

The present disclosure provides staircase structures for a 3D NAND memory that can be placed in the center of the memory array with reduced routing congestion and better area efficiency. The number of metal interconnect layers and manufacturing cost can therefore be reduced.

Figure 4:
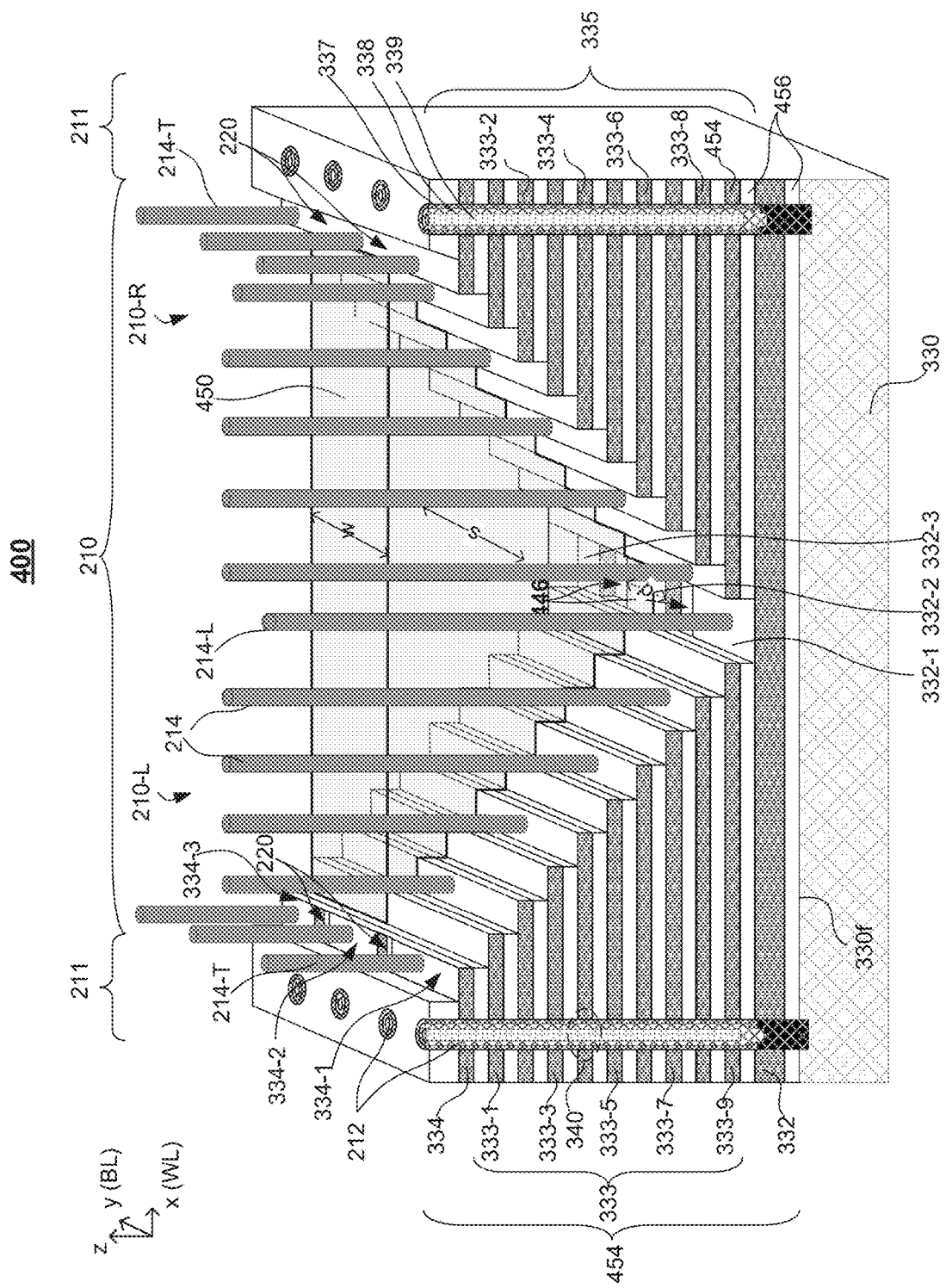
FIG. 4 illustrates a perspective view of an exemplary 3D memory structure, according to some embodiments of the present disclosure.
Figure 5:
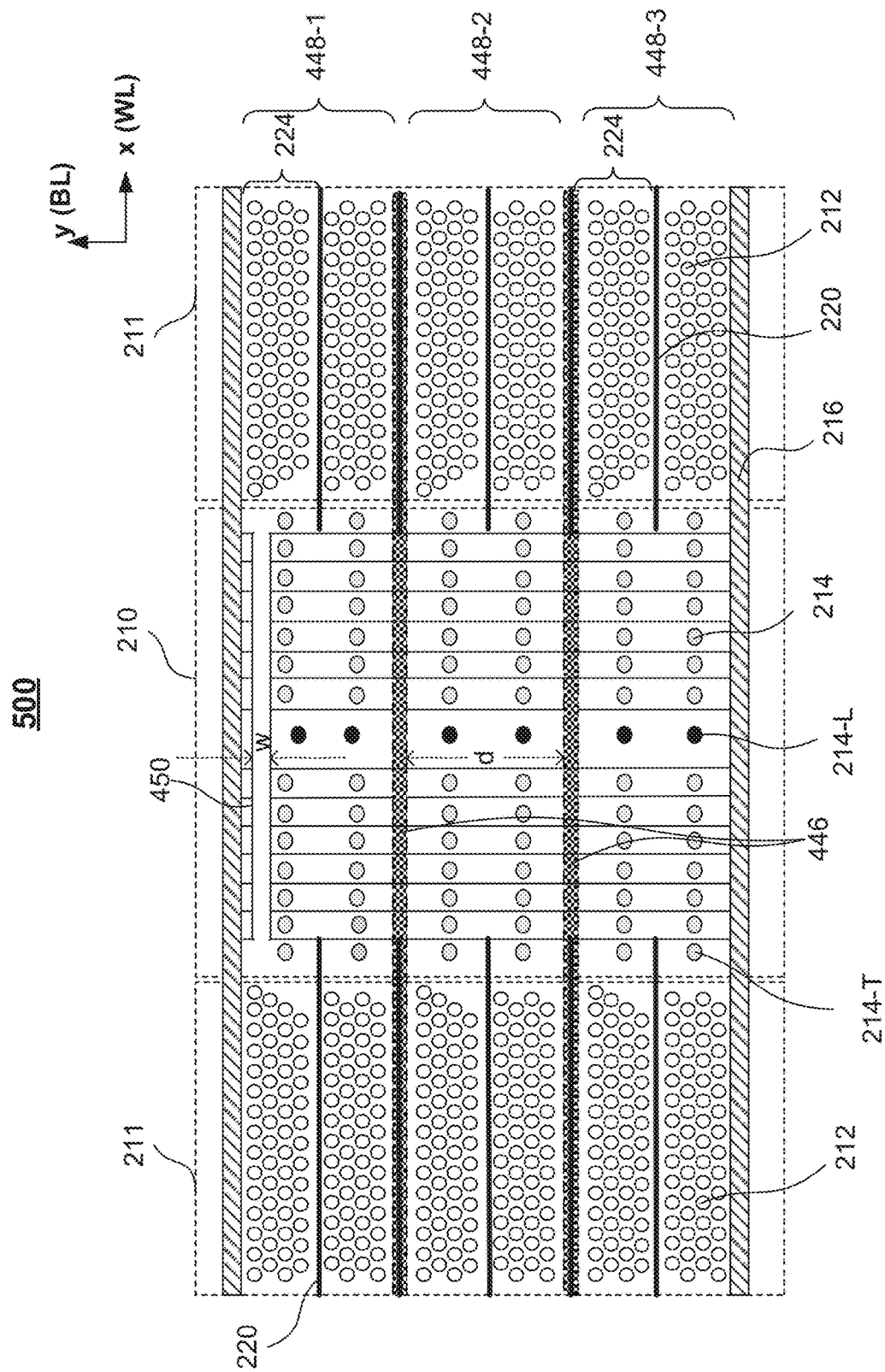
FIGS. 5 and 6 illustrate top-down views of 3D memory structures, according to some embodiments of the present disclosure.

FIG. 4 illustrates a perspective view of a 3D memory structure 400, according to some embodiments of the present disclosure. The 3D memory structure 400 includes a staircase region, similar to the staircase region 210 discussed above with reference with FIGS. 2 and 3. FIG. 5 illustrates a top down view of a 3D memory array 500, according to some embodiments of the present disclosure. The staircase region 210 of the 3D memory structure 400 can be arranged in the middle of the 3D memory array 500. The 3D memory array 500 can be any portion of the memory block 103 in FIG. 1.

Referring to FIG. 4, the 3D memory structure 400 includes a substrate (e.g., the substrate 330 in FIG. 3) and a film stack of alternating conductive and dielectric layers (e.g., the film stack 335 in FIG. 3) disposed on a front surface 330f of the substrate 330. In some embodiments, the substrate 330 can provide a platform for forming subsequent structures. In some embodiments, the subsequent structures are formed in a vertical direction (e.g., the z-direction orthogonal to the front surface of substrate 330). In FIG. 4, the x- and y-directions are along a plane parallel to the front surface 330f of the substrate, and are parallel to the respective word line (WL) and bit line (BL) directions shown in FIGS. 1-3.

In some embodiments, the substrate 330 can be any suitable semiconductor substrate having any suitable semiconductor materials, such as monocrystalline, polycrystalline or single crystalline semiconductors. For example, the substrate 330 can include silicon, silicon germanium (SiGe), germanium (Ge), silicon on insulator (SOI), germanium on insulator (GOI), gallium arsenide (GaAs), gallium nitride, silicon carbide, III-V compound, or any combinations thereof. In some embodiments, the substrate 330 can include a layer of semiconductor material formed on a handle wafer, for example, glass, plastic, or another semiconductor substrate.

A front surface 330f of the substrate 330 is also referred to as a "main surface" or a "top surface" of the substrate herein. Layers of materials can be disposed on the front surface 330f of the substrate 330. A "topmost" or "upper" layer is a layer farthest or farther away from the front surface 330f of the substrate. A "bottommost" or "lower" layer is a layer closest or closer to the front surface 330f of the substrate.

In some embodiments, the film stack 335 includes a plurality of conductive layers 454 and dielectric layers 456 alternatingly stacked on top of each other. The film stack 335 can extend in a lateral direction parallel to the front surface 330f of the substrate 330, while the conductive layers 454 and the dielectric layers 456 can alternate in the vertical direction. In other words, except the one at the bottom of the film stack 335, each conductive layer 454 can be sandwiched by two dielectric layers 456, and each dielectric layer 456 can be sandwiched by two conductive layers 454. The conductive layers 454 can each have the same thickness or have different thicknesses. Similarly, the dielectric layers 456 can each have the same thickness or have different thicknesses. In some embodiments, the conductive layers 454 can include conductor materials such as W, Co, Cu, Al, Ti, Ta, TiN, TaN, Ni, doped silicon, silicides (e.g., NiSix, WSix, CoSix, TiSix) or any combination thereof. The dielectric layers 456 can include dielectric materials such as silicon oxide, silicon nitride, silicon oxynitride, or any combination thereof. In some embodiments, the dielectric layers 456 can also include high-k dielectric materials, for example, hafnium oxide, zirconium oxide, aluminum oxide, tantalum oxide, lanthanum oxide, and/or any combination thereof.

The formation of the film stack 335 can include disposing the dielectric layers 456 to each have the same thickness or to have different thicknesses. Example thicknesses of the dielectric layers 456 can range from 10 nm to 500 nm, preferably about 25 nm. Similarly, the conductive layers 454 can each have the same thickness or have different thicknesses. Example thicknesses of the conductive layers 454 can range from 10 nm to 500 nm, preferably about 35 nm. It should be understood that the number of conductive layers 454 and dielectric layers 456 in FIG. 4 is for illustrative purposes only and that any suitable number of layers can be included in the film stack 335. In some embodiments, the film stack 335 can include layers in addition to the conductive layers 454 and the dielectric layers 456, and can be made of different materials and/or with different thicknesses.

In some embodiments, the 3D memory structure 400 can also include a plurality of memory cells vertically stacked as memory strings, similar to the memory cells 340 and memory strings 212 in FIG. 3. As shown in FIG. 4, the memory string 212 extends through the film stack 335, where each memory string 212 can include the core filling film 339, the channel layer 338 and the memory film 337 (similar to those in FIG. 3). The center of the memory string 212 can be the core filling film 339. The channel layer 338 surrounds the core filling film 339, and the memory film 337 surrounds the channel layer 338. In some embodiments, the channel layer 338 includes silicon, such as amorphous silicon, polysilicon, or single crystalline silicon. In some embodiments, the memory film 337 is a composite layer including a tunneling layer, a storage layer (also known as "charge trap/storage layer"), and a blocking layer. Each memory string 212 can have a cylinder shape (e.g., a pillar shape). In some embodiments, the channel layer 338, the tunneling layer, the storage layer, and the blocking layer can be arranged along a direction from the center toward the outer surface of the pillar in this order. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide).

In some embodiments, the conductive layers 454 can act as the control gates or word lines 333 for the memory cells 340. As shown in FIG. 4, the memory string 212 can also include one or more lower select gates 332 (e.g., a source select gate or bottom select gate) at a lower end (i.e., a source terminal) of the memory string 212. The memory string 212 can also include one or more top select gates 334 (e.g., a drain select gate) at an upper end (i.e. a drain terminal) of the memory string 212. As used herein, the "upper end" of a component (e.g., memory string 212) is the end further away from the substrate 330 in the vertical direction, and the "lower end" of the component (e.g., memory string 212) is the end closer to the substrate 330 in the vertical direction. As shown in FIG. 4, for each memory string 212, the top select gate 334 can be above the lower select gate 332. FIG. 4 illustrates one lower select gate 332 and one top select gate 334 in the film stack 335. It should be understood that any suitable number of conductive layers 454 in the film stack 335 can be used as lower select gates 332 and one top select gates 334.

In some embodiments, the 3D memory structure 400 can include one or more staircase structures in the staircase region 210, where each of the conductive layer 454 terminates at a different length in the horizontal x-direction. In some embodiments, the top select gate 334 is the shortest, and the lower select gate 332 is the longest.

In some embodiments, the 3D memory structure 400 further includes a plurality of contact structures, similar to the contact structures 214 in FIGS. 2 and 3. The top select gate 334, the word lines 333 and the lower select gate 332 can be electrically connected with one or more contact structures 214. Through the contact structures 214, metal interconnect lines formed at back-end-of-line processes can be electrically connected to each conductive layer 454. Accordingly, by using the staircase structure, each memory cell 340 in the 3D memory structure 400 can be controlled by corresponding word line 333 to perform read, write, or erase operation. In some embodiments, the contact structure 214 can include any suitable conductive material, for example, W, Ti, TiN, Cu, TaN, Al, Co, Ni, or any combination thereof.

In some embodiments, the staircase region 210 can include two staircase structures 210-L and 210-R, symmetric with each other along y-direction. In some embodiments, a first subset of the contact structures is formed on the conductive layers of the first staircase structure, and a second subset of the contact structures is formed on the conductive layers of the second staircase structure. The second subset of the contact structures is different from the first subset of the contact structures. In some embodiments, the contact structures 214 can be formed for every the other conductive layer 454 in each staircase structure. For example, the contact structures 214 can be formed to electrically contact the odd number of word lines 333-1, 333-3, 333-5, . . . , for the staircase structure 210-L, and can be formed to electrically contact the even number of word lines 333-2, 333-4, 333-6, . . . , for the staircase structure 210-R. As a result, minimum spacing s between contact structures 214 on different word lines 333 can be increased (e.g., doubled). Therefore, process window for contact structures 214 can be increased and manufacturing yield can be improved. It is noted that each staircase structure can include any suitable number of contact structures 214 on the conductive layer 454 and is not limited to one contact structure as illustrated in FIG. 4.

In some embodiments, the staircase region 210 can be disposed anywhere in a memory array. In some embodiments, the staircase region 210 can be disposed in the center of a memory array. For example, the staircase region 210 can be placed in the 3D memory array 500, where the 3D memory array 500 can be any portion of the memory block 103 in FIG. 1. Referring to FIGS. 4 and 5, the memory strings 212 in the channel structure regions 211 can be distributed on opposite sides of the staircase region 210 along x-direction.

In some embodiments, the 3D memory structure 400 also includes a staircase bridge 450 that extends along x-direction parallel to the word lines 333. In x-direction, the staircase bridge 450 is longer on top and shorter at bottom, where top and bottom are relative to the distance from the substrate. The staircase bridge 450 has a width w in y-direction, which is less than the total width of the staircase structures 210-L and 210-R. The staircase bridge 450 can connect corresponding word lines 333 between the staircase structure 210-L and the staircase structure 210-R. For example, the word line 333 in the staircase structure 210-L and corresponding word line 333 in the staircase structure 210-R, which are formed by the same conductive layer 454, can be electrically connected through the staircase bridge 450. Thus, for each staircase region 210, only one set of word line drivers with one set of interconnect metal lines are needed to address each word line 333, where each word line 333 can be electrically connected to at least one contact structure 214 either from the staircase structure 210-L or the staircase structure 210-R.

In some embodiments, the staircase bridge 450 can also be formed in the film stack 335 and can also include the plurality of conductive layers 454 and dielectric layers 456. In this example, the staircase bridge 450 can be disposed vertically on the staircase structures 210-L and 210-R, where a bottom of the staircase bridge 450 can be in contact with the bottom select gate 332. In some embodiments, the staircase bridge 450 only connects the word lines 333 between the staircase structures 210-L and 210-R. In some embodiments, the staircase bridge 450 can also connect the top select gate 334 between the staircase structures 210-L and 210-R.

In some embodiments, the staircase bridge 450 can include conductive material different from the conductive layer 454. In some embodiments, the staircase bridge 450 can include a thickness different from the conductive layer 454.

In some embodiments, the 3D memory structure 400 further includes one or more back select gate (BSG) cut 446 that can separate the lower select gate 332 (also referred to as back select gate) into two or more sub-BSGs 332-1, 332-2, . . . , where the sub-BSGs 332-1, 332-2, . . . , are electrically isolated from each other. Referring to FIGS. 4 and 5, in some embodiments, the BSG cut 446 and the sub-BSGs 332-1, 332-2, . . . , extend along x-direction and can divide the memory array 500 into multiple sub-blocks 448. By introducing BSG cuts 446, a memory block of a 3D memory device (for example the memory block 103 in FIG. 1 and the memory array 500 in FIG. 5) can have improved bottom select transistors (BSTs) due to reduced parasitic capacitance and coupling effects between the BSG 332 and adjacent dielectric layers. In addition, the divided BSG structure allows erasing a specific sub-block rather than the entire memory block 103. Accordingly, the erasing time and data transfer time could be reduced significantly, and data storage efficiency can be improved as well. For illustration purpose only, FIGS. 4 and 5 show two BSG cuts 446 and three sub-blocks 448. It is noted that the BSG cuts 446 and sub-blocks 448 can have any suitable number and is not so limited.

In some embodiments, the staircase bridge 450 can have a width w smaller than a width d of the sub-block 448 such that at least one contact structure 214 (e.g., the contact structure 214-L) can be formed on each of the sub-BSGs 332-1, 332-2, . . . in the staircase region 210, as shown in the example in FIG. 5.

In some embodiments, the 3D memory structure 400 can also include one or more top select gate (TSG) cut 220. The TSG cut 220 can separate TSG 334 into two or more sub-TSGs 334-1, 334-2, 334-3, . . . , and can divide each memory block 103 into the memory slices 224. In some embodiments, the 3D memory structure 400 can have the same number of TSG cuts 220 and BSG cuts 446 and can be aligned with each other, as shown in the example in FIG. 4. In some embodiments, the 3D memory structure 400 can have more TSG cuts 220 than BSG cuts 446, e.g., in the 3D memory array 500 in FIG. 5. In this example, TSG cuts 220 can further divide sub-block 448 into two or more memory slices 224. In some embodiments, contact structures 214-T can be formed on each sub-TSGs 334-1, 334-2, 334-3, . . . for each staircase structure 210-L/210-R. In some embodiments, the staircase bridge 450 can also be formed to electrically connect one or more sub-TSGs 334 of the two staircase structures 210-L and 210-R. In some embodiments, each memory slice 224 can be read or programmed independently through controlling the corresponding sub-TSG. As such, the reading/programming time can be reduced, and data transfer and storage efficiency can be improved. For illustration purpose, three TSG cuts 220 in each staircase structure are shown in FIG. 4. It is noted that the TSG cuts 220 can have any suitable number and is not so limited.

In some embodiments, the 3D memory structure 400 can be filled with any suitable insulating materials such as silicon oxide, silicon nitride, silicon oxynitride, SiOCN, or any combination thereof. For example, the insulating materials can be filled inside the BSG cuts 446 and TSG cuts 220, between the contact structures 214 and in the staircase region 210, all of which are omitted in FIG. 4 for simplicity.

The staircase bridge 450 can be disposed anywhere in the staircase region 210. FIGS. 4 and 5 illustrates the configuration where the staircase bridge 450 is disposed on the sub-block 448-1 close to the slit structure 216, or near an edge of the memory array 500. In some embodiments, the staircase bridge 450 can be disposed in the center of the staircase region 210, e.g., in the sub-block 448-2.

To reduce resistance, in some embodiments, the width w of the staircase bridge 450 can be designed wider than that shown in FIGS. 4 and 5. In this example, process window for forming contact structure 214-L on one or more sub-BSG 332 can be too small when the width w of the staircase bridge 450 is close to the width d of the sub-block 448.

Figure 6:
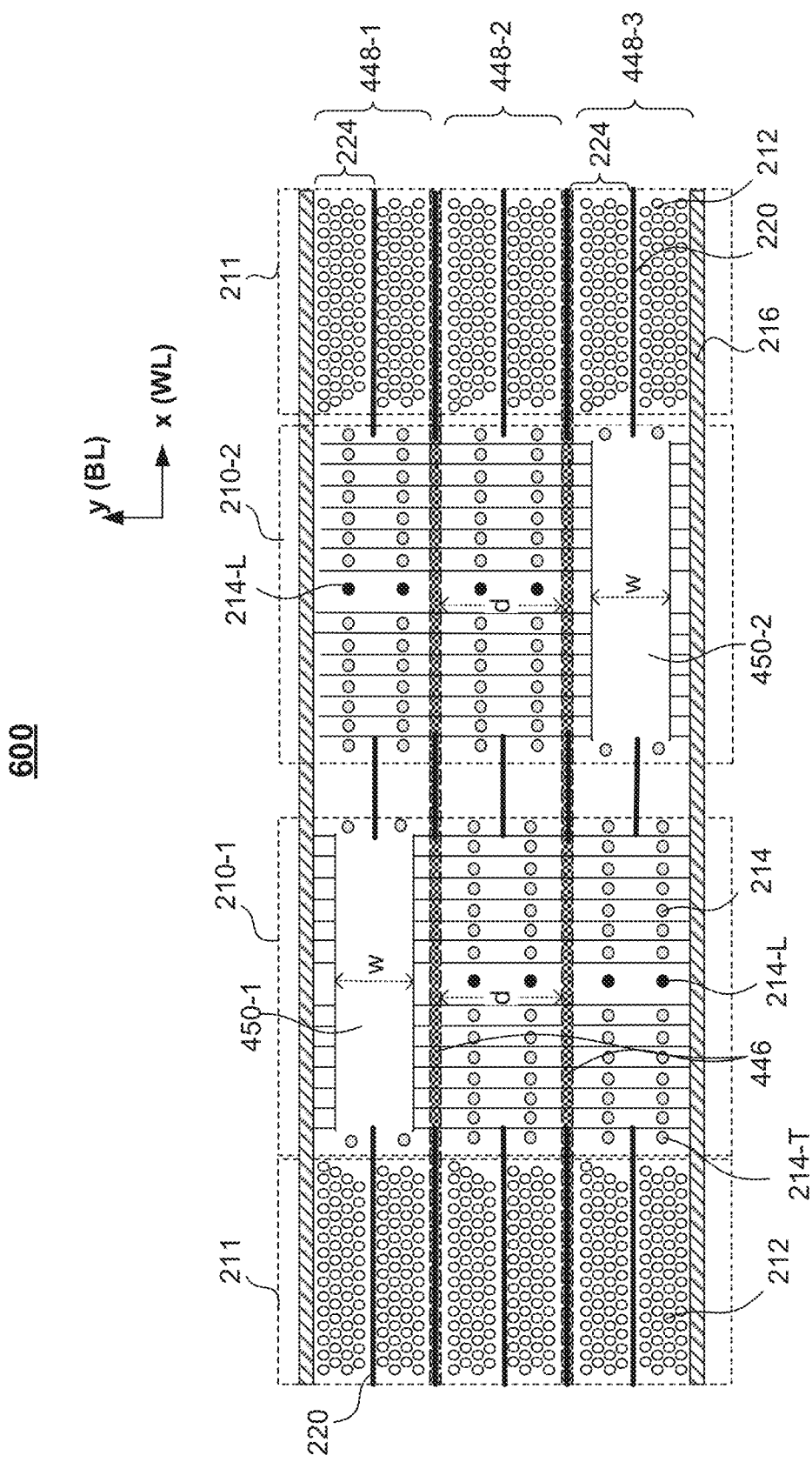

FIG. 6 illustrates a top down view of a 3D memory array 600, according to some embodiments of the present disclosure. The 3D memory array 600 can include two or more staircase regions 210-1, 210-2, . . ., where the staircase regions 210-1, 210-2, . . . can be disposed in the center of the 3D memory array 600. Here, 3D memory array 600 can be any portion of the memory block 103 in FIG. 1. The memory strings 212 and the channel structure region 211 can be disposed on opposite sides of the staircase regions 210-1, 210-2, . . . along x-direction. In this example, the width w of the staircase bridge 450 is close to or larger than the width d of the sub-blocks 448. The staircase bridge 450 can be disposed on a different sub-block 448 in the two or more staircase regions such that at least one contact structure 214 can be formed for each sub-BSG. For example, as shown in FIG. 6, the staircase bridge 450-1 in the staircase region 210-1 can be disposed in sub-block 448-1 and the staircase bridge 450-2 in the staircase region 210-2 can be disposed in sub-block 448-3. Accordingly, at least one the contact structure 214-L can be formed on each sub-BSG of each sub-block 448. It is noted that configuration of the 3D memory array 600 in FIG. 6 is exemplary. Other arrangements of the staircase regions 210 can also be formed in the 3D memory array 600.

In some embodiments, the staircase bridge 450 can be implemented in various staircase structures to form staircase regions in the center of a memory array.

Figures 7A, 7B:
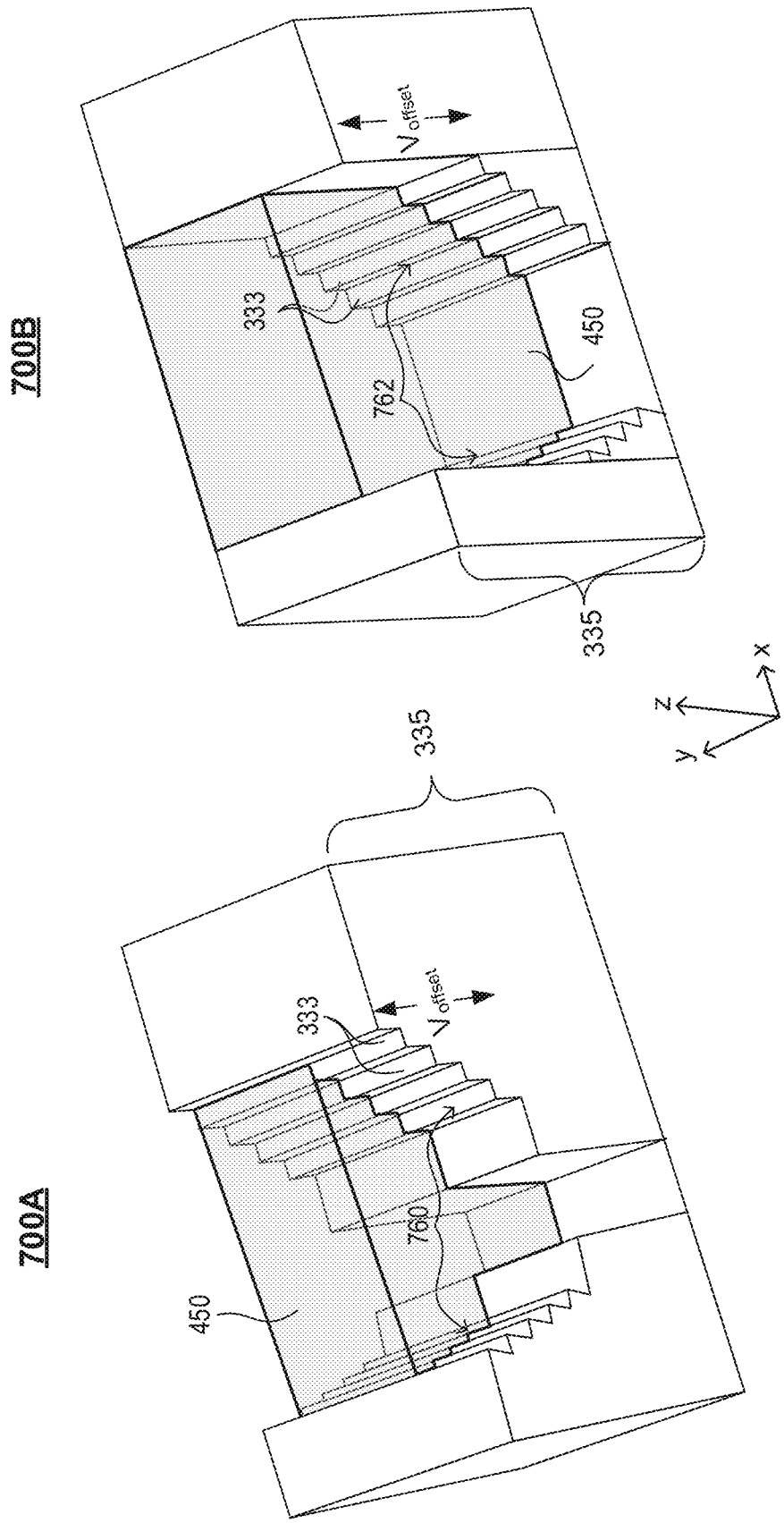
FIGS. 7A, 7B, 8A and 8B illustrate perspective views of 3D memory structures, according to some embodiments of the present disclosure.

FIGS. 7A and 7B illustrate staircase structures 700A and 700B, according to some embodiments of the present disclosure, where the staircase structures 700A can be used in the staircase region 210-1 and the staircase structures 700B can be used in the staircase region 210-2 for the 3D memory array 600 in shown FIG. 6, or vice versa.

In this example, staircase structures 700A can provide electrical connections to word lines 333 in an upper portion of the film stack 335, and the staircase structures 700B can provide electrical connections to word lines 333 in a lower portion of the film stack 335. The staircase structures 700A include a first set of staircase steps 760 and the staircase structures 700B include a second set of staircase steps 762 having a vertical offset $V_{offset}$ from the first set of staircase steps. For example, when there are a total of n number of word lines, the first set of staircase steps 760 can be formed for n/2 number of word lines 333 in the upper portion of the film stack 335, and the second set of staircase steps 762 can be formed for n/2 number of word lines 333 in the lower portion of the film stack 335. Accordingly, contact structures (omitted from FIGS. 7A and 7B for clarity) can be formed on the staircase structures 700A and 700B to provide electrical connections to respective n/2 number of word lines. Similar to the 3D memory structure 400 and 3D memory arrays 500 and 600, staircase bridges 450 can also be formed for the staircase structures 700A and 700B to connect the word lines 333 of the same tier (i.e., formed from the same conductive layer in the film stack 335). In some embodiments, the staircase bridges 450 also includes the conductive layers and dielectric layers of the film stack 335, similar to the staircase structures in FIG. 4. In some embodiments, the staircase structures 700A and 700B can also include TSG cuts and BSG cuts, similar to the TSG cuts 220 and BSG cuts 446 discussed previously.

Figures 8A, 8B:
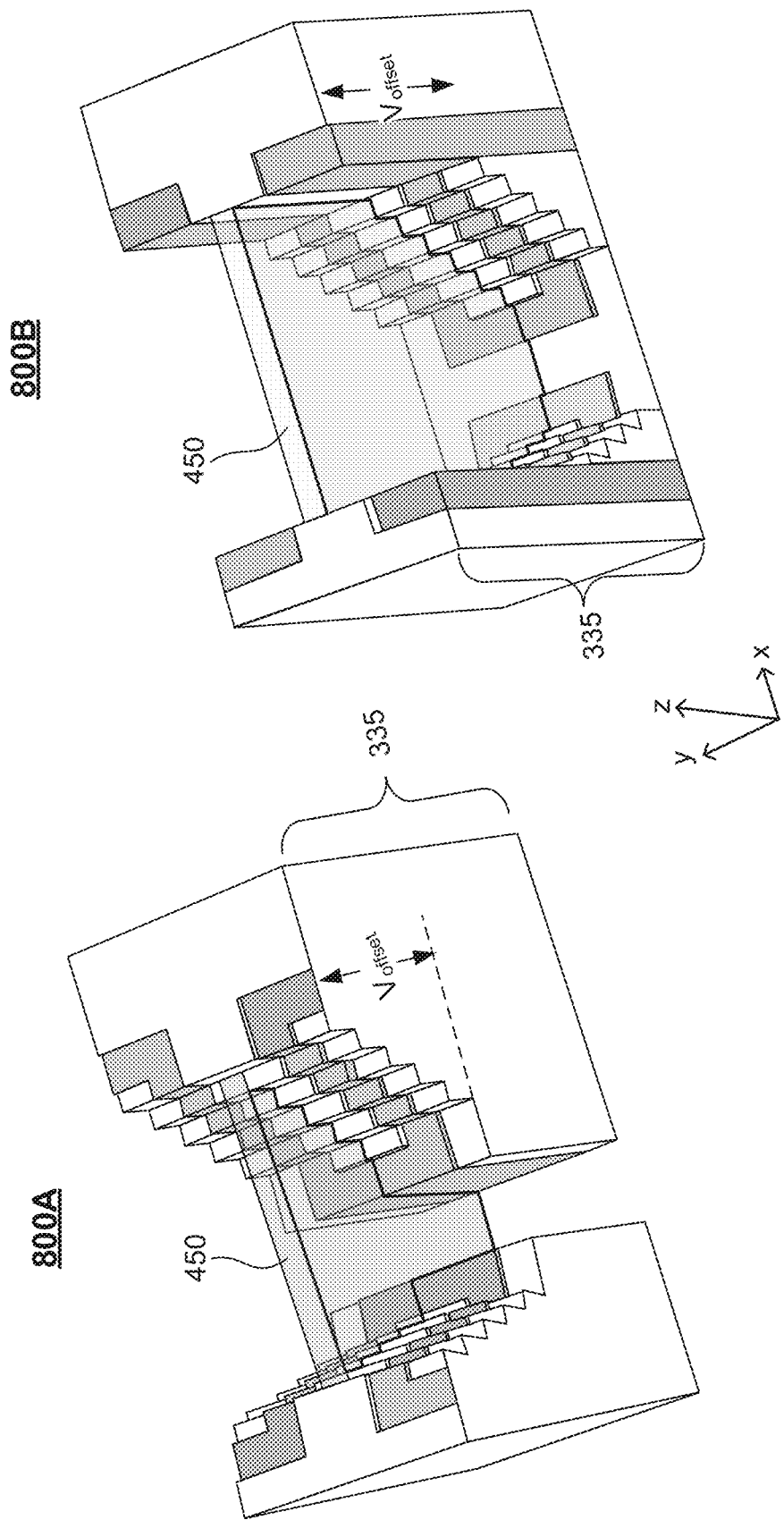

FIGS. 8A and 8B illustrate staircase structures 800A and 800B, according to some embodiments of the present disclosure, where the staircase structures 800A can be used in the staircase region 210-1 and the staircase structures 800B can be used in the staircase region 210-2 for the 3D memory array 600 in shown FIG. 6, or vice versa.

The staircase structures 800A and 800B can also have the vertical offset $V_{offset}$, similar to the staircase structures 700A and 700B in FIGS. 7A and 7B. In addition to staircase steps in x-direction, the staircase structures 800A and 800B also include staircase steps in y-direction. The details of staircase structures with staircase steps in both x- and y-directions can be found in co-pending U.S. patent application Ser. No. 16/458,401 filed on Jul. 1, 2019 and titled "Three-Dimensional Memory Device and Fabrication Methods Thereof," and U.S. patent application Ser. No. 16/422,434 filed on May 24, 2019 and titled "Staircase Structure with Multiple Divisions for Three-Dimensional Memory," both of which are incorporated herein by reference in their entirety.

In some embodiments, the staircase structures 800A and 800B can have $n_y$ number of steps in y-direction, where each step in y-direction exposes one conductive layer in the film stack 335. In some embodiments, the staircase structures 800A and 800B can have $n_x$ number of steps in x-direction, where each step in x-direction has a step height same as a thickness of $(n_y+1)$ number of conductive layers and dielectric layers in the film stack 335.

In some embodiments, the staircase structures 800A and 800B can also include the staircase bridges 450. Similarly, the staircase bridges 450 extend in x-direction and connect the conductive layers (or word lines) on the same tier (at the same level of staircase step). In this example, contact structures for word lines can be formed on staircase steps in both x-direction and y-direction.

Figure 9:
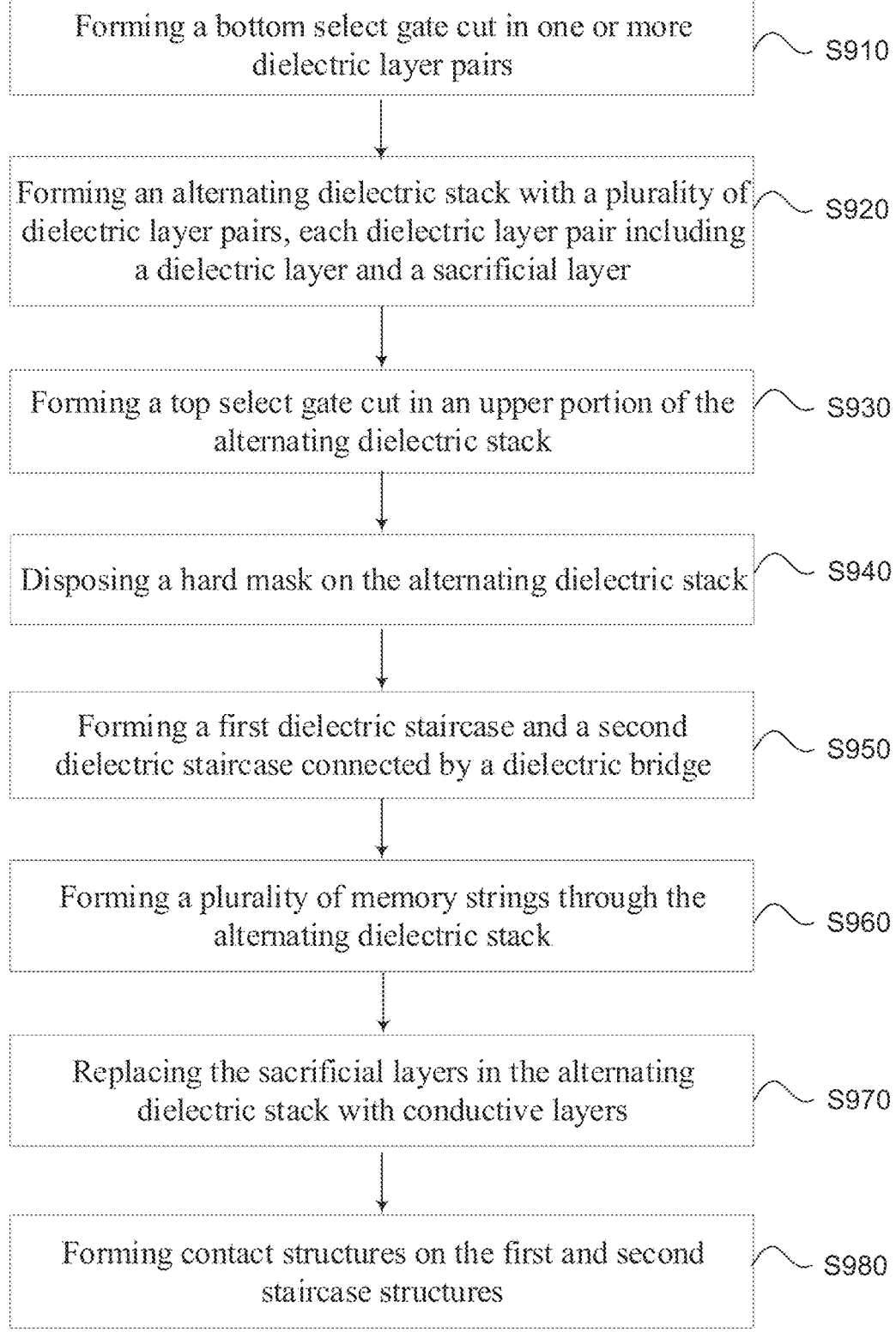
FIG. 9 illustrates a flow diagram of an exemplary method for forming a 3D memory structure in accordance with some embodiments of the present disclosure.

FIG. 9 illustrates an exemplary fabrication process 900 for forming a 3D memory structure similar to the 3D memory structure 400 shown in FIG. 4, accordance to some embodiments of the present disclosure. It should be understood that the process steps shown in fabrication process 900 are not exhaustive and that other process steps can be performed as well before, after, or between any of the illustrated process steps. In some embodiments, some process steps of exemplary fabrication process 900 can be omitted or other process steps can be included, which are not described here for simplicity. In some embodiments, process steps of fabrication process 900 can be performed in a different order and/or vary.

FIGS. 10A-10C, 11A-11B, 12A-12B, 13A-13B, 14A-14C, 15A-15B, 16, 17A-17B are cross-sectional views or top-down views of a 3D memory device at various process steps, according to some embodiments of the present disclosure.

Figure 10C:
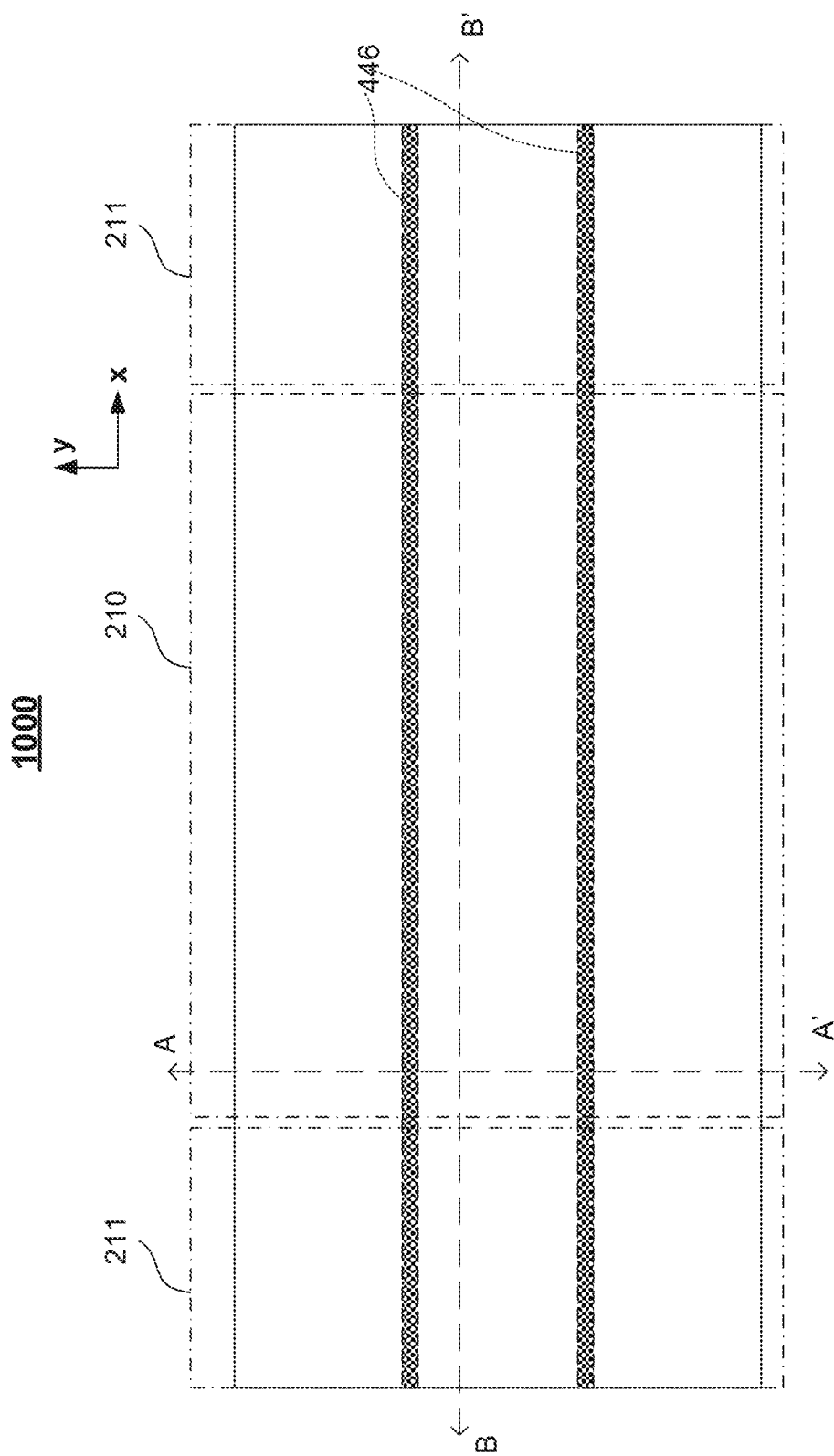
FIG. 10C illustrates a top-down view of the 3D memory structure in FIGS. 10A and 10B, according to some embodiments of the present disclosure.

As shown in FIG. 9, fabrication process 900 starts at process step S910, where a bottom select gate (BSG) cut 446 can be formed in a dielectric layer pair 1066. FIGS. 10A and 10B illustrate cross-sectional views of an exemplary structure 1000 along x- and y-directions, respectively, according to some embodiments of the present disclosure. FIG. 10C illustrate a top-down view of the structure 1000. The cross-sections in FIGS. 10A and 10B are along BB' and AA' lines. The x- and y-directions are along the word-line and bit-line directions as shown in FIGS. 1, 2, 5 and 6. The structure 1000 includes the dielectric layer pair 1066 disposed on the substrate 330. In some embodiments, the structure 1000 can include multiple dielectric layer pairs 1066, where each dielectric layer pair 1066 includes the dielectric layer 456 (also referred to a first dielectric layer) and a sacrificial layer 1068 (also referred to as a second dielectric layer) that is different from the dielectric layer 456.

The dielectric layer 456 can be similar to the dielectric layer discussed above with reference to FIG. 4. In some embodiments, the dielectric layer 456 includes any suitable insulating materials, for example, silicon oxide, silicon oxynitride, silicon nitride, TEOS or silicon oxide with F-, C-, N-, and/or H-incorporation. The dielectric layer 456 can also include high-k dielectric materials, for example, hafnium oxide, zirconium oxide, aluminum oxide, tantalum oxide, or lanthanum oxide films. In some embodiments, the dielectric layer 456 can be any combination of the above materials.

The formation of the dielectric layer 456 on the substrate 330 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

In some embodiments, the sacrificial layer 1068 includes any suitable material that is different from the dielectric layer 456 and can be removed selectively with respect to the dielectric layer 456. For example, the sacrificial layer 1068 can include silicon oxide, silicon oxynitride, silicon nitride, TEOS, poly-crystalline silicon, poly-crystalline germanium, poly-crystalline germanium-silicon, and any combinations thereof. In some embodiments, the sacrificial layer 1068 also includes amorphous semiconductor materials, such as amorphous silicon or amorphous germanium. The sacrificial layer 1068 can be disposed using a similar technique as the dielectric layer 456, such as CVD, PVD, ALD, thermal oxidation or nitridation, or any combination thereof.

In some embodiments, the dielectric layer 456 can be silicon oxide and the sacrificial layer 1068 can be silicon nitride. The thickness of the dielectric layer 456 and the sacrificial layer 1068 can range between 10 nm to 500 nm.

In some embodiments, one or more BSG cuts 446 can be formed in the dielectric layer pair 1066, extending vertically into the substrate 330. The BSG cuts 446 extend laterally in x-direction with a width $t_1$ ranging from 50 nm to 500 nm. Forming the BSG cuts 446 includes, but not limited to, forming one or more trenches in the dielectric layer pair 1066 extending into the substrate 330, and filling the one or more trenches with insulating materials such as silicon oxide, silicon nitride, silicon oxynitride, SiOCN, or any combination thereof. In some embodiments, forming the BSG cuts 446 further includes forming a co-planar surface using chemical mechanical polishing (CMP).

In some embodiments, peripheral devices (not shown) can be formed in the periphery region 105 (see FIG. 1) on the front surface 330f of the substrate 330. In some embodiments, active device areas (not shown) can also be formed in the memory blocks 103 (see FIG. 1) on the front surface 330f of the substrate 330. In some embodiments, the substrate 330 can further include an insulating film 331 on the front surface 330f (not shown in FIG. 4). The insulating film 331 can be made of the same or different material from the alternating dielectric stack 1164.

The peripheral devices can include any suitable semiconductor devices, for example, metal oxide semiconductor field effect transistors (MOSFETs), diodes, resistors, capacitors, etc. The peripheral devices can be used in the design of digital, analog and/or mixed signal circuits supporting the storage function of the memory core, for example, row and column decoders, drivers, page buffers, sense amplifiers, timing and controls.

The active device areas in the memory blocks are surrounded by isolation structures, such as shallow trench isolation. Doped regions, such as p-type doped and/or n-type doped wells, can be formed in the active device area according to the functionality of the array devices in the memory blocks.

In some embodiments, the structure 1000 of the 3D memory device can include the staircase region 210 and the channel structure region 211. In some embodiments, the channel structure regions 211 can be arranged on opposite sides of the staircase region 210 along x-direction. The channel structure region 211 can be used to form the memory strings 212 in the subsequent processes, where the staircase region 210 can be used to form staircase structures.

Figure 11A:
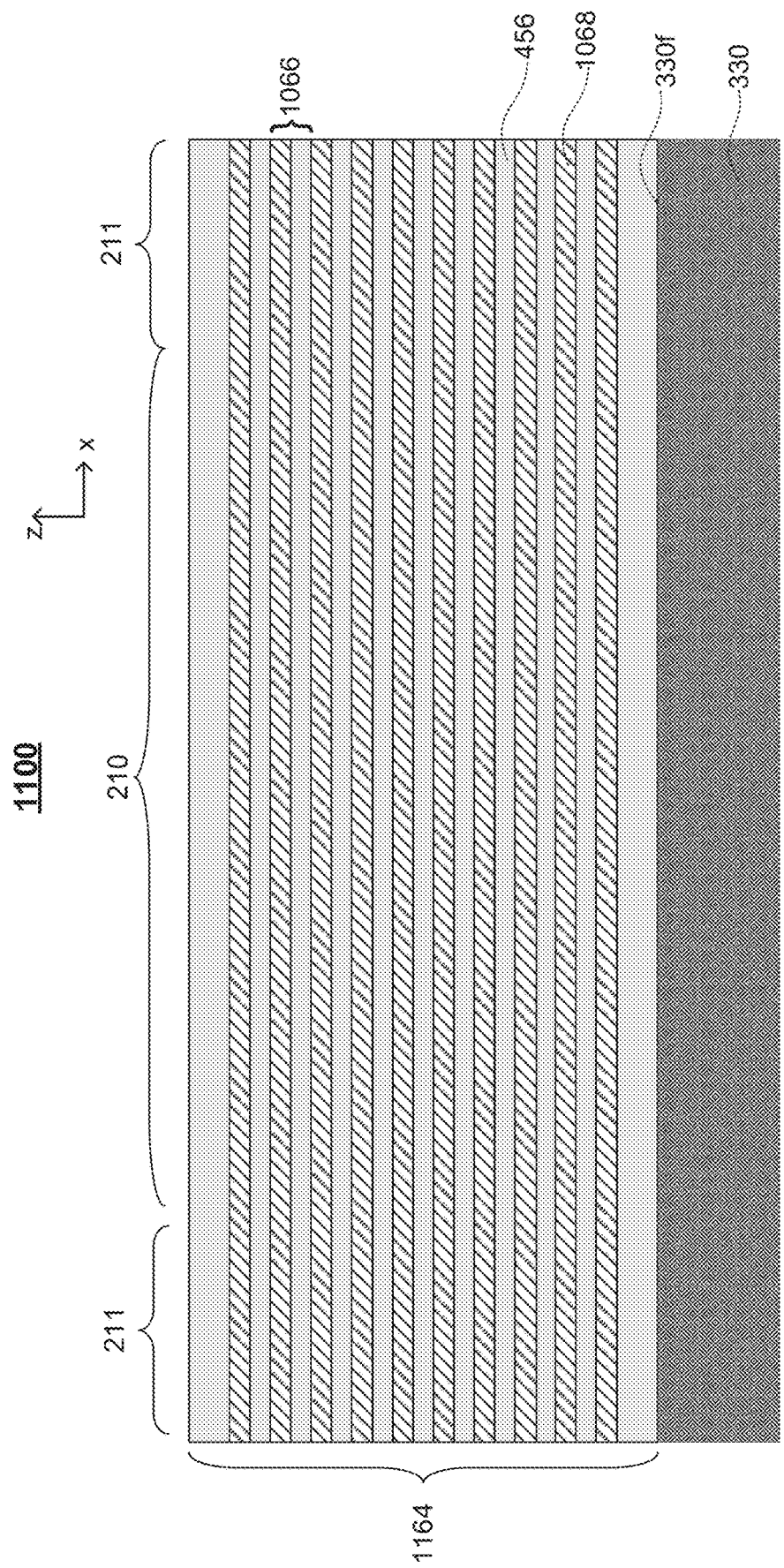
FIGS. 11A and 11B illustrate cross-sectional views a 3D memory structure at certain process step, according to some embodiments of the present disclosure.
Figure 11B:
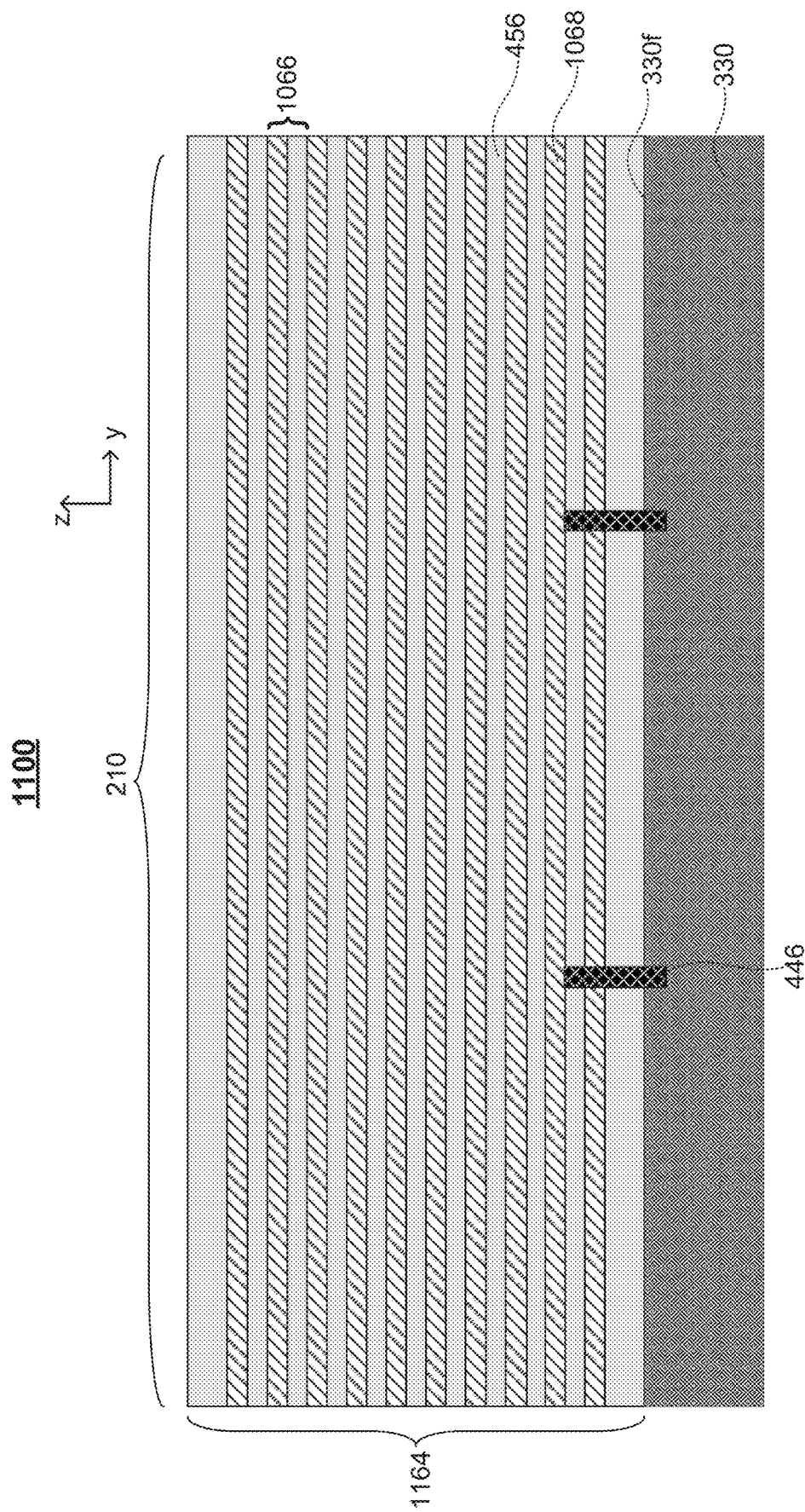

At process step S920, a plurality of dielectric layer pairs 1066 can be disposed on the substrate 330 to form an alternating dielectric stack 1164. FIGS. 11A and 11B illustrate cross-sectional views of an exemplary structure 1100 along x- and y-directions, respectively, according to some embodiments of the present disclosure. The alternating dielectric stack 1164 extends in a lateral direction that is parallel to the front surface 330f of the substrate 330. The dielectric layers 456 and the sacrificial layers 1068 can be alternatingly stacked on top of each other in the alternating dielectric stack 1164. In the other words, each sacrificial layer 1068 can be sandwiched between two dielectric layers 456, and each dielectric layer 456 can be sandwiched between two sacrificial layers 1068 (except the bottommost and the topmost layer).

The formation of the alternating dielectric stack 1164 can include disposing the dielectric layers 456 to each have the same thickness or to have different thicknesses. Example thicknesses of the dielectric layers 456 can range from 10 nm to 500 nm, preferably about 25 nm. Similarly, the sacrificial layer 1068 can each have the same thickness or have different thicknesses. Example thicknesses of the sacrificial layer 1068 can range from 10 nm to 500 nm, preferably about 35 nm. It should be understood that the number of dielectric layer pairs 1066 in FIG. 11 is for illustrative purposes only and that any suitable number of layers can be included in the alternating dielectric stack 1164.

In some embodiments, the alternating dielectric stack 1164 can include layers in addition to the dielectric layer 456 and the sacrificial layer 1068, and can be made of different materials and/or with different thicknesses.

Figure 12A:
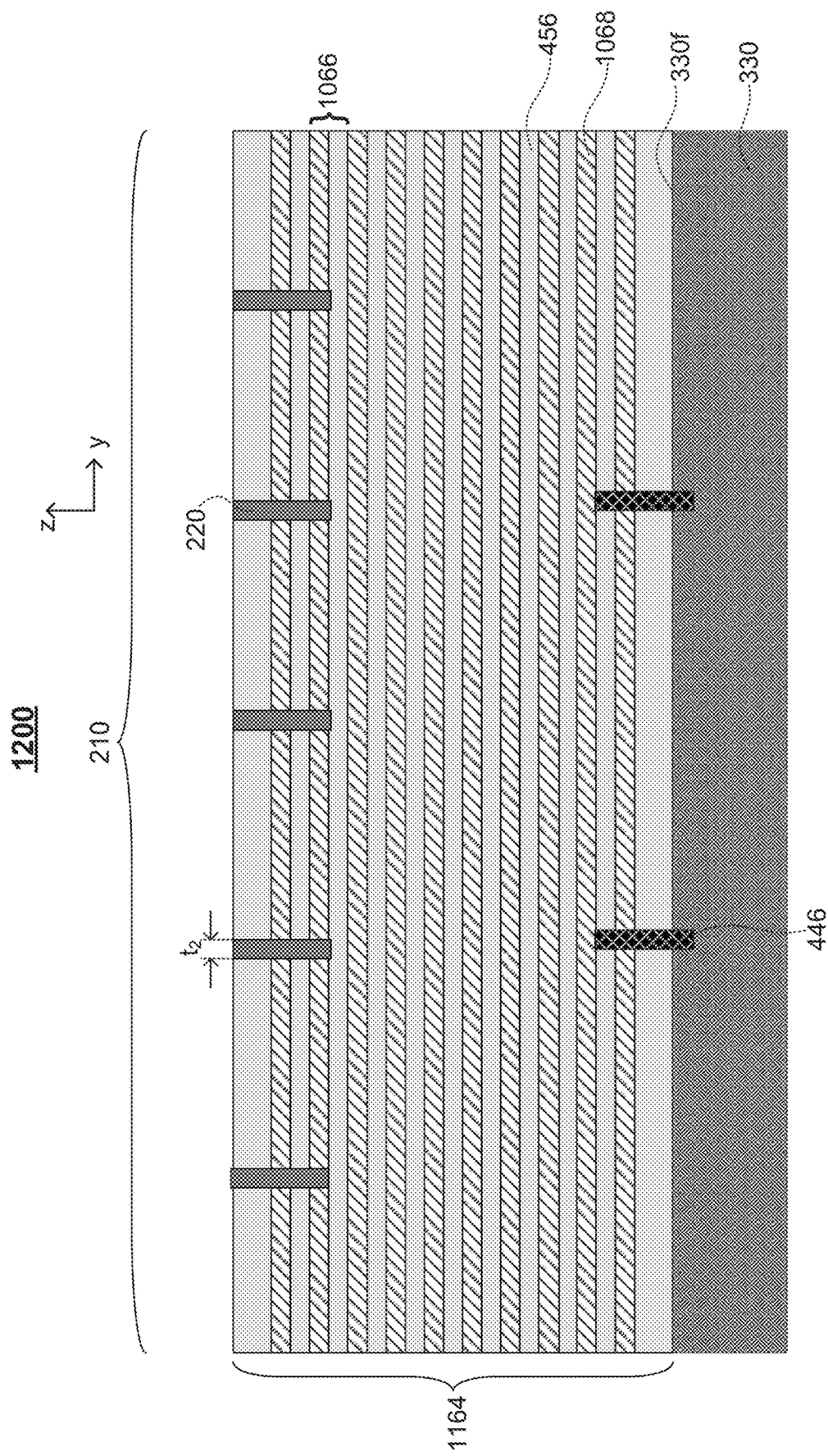
FIG. 12A illustrates a cross-sectional view a 3D memory structure at certain process step, according to some embodiments of the present disclosure.
Figure 12B:
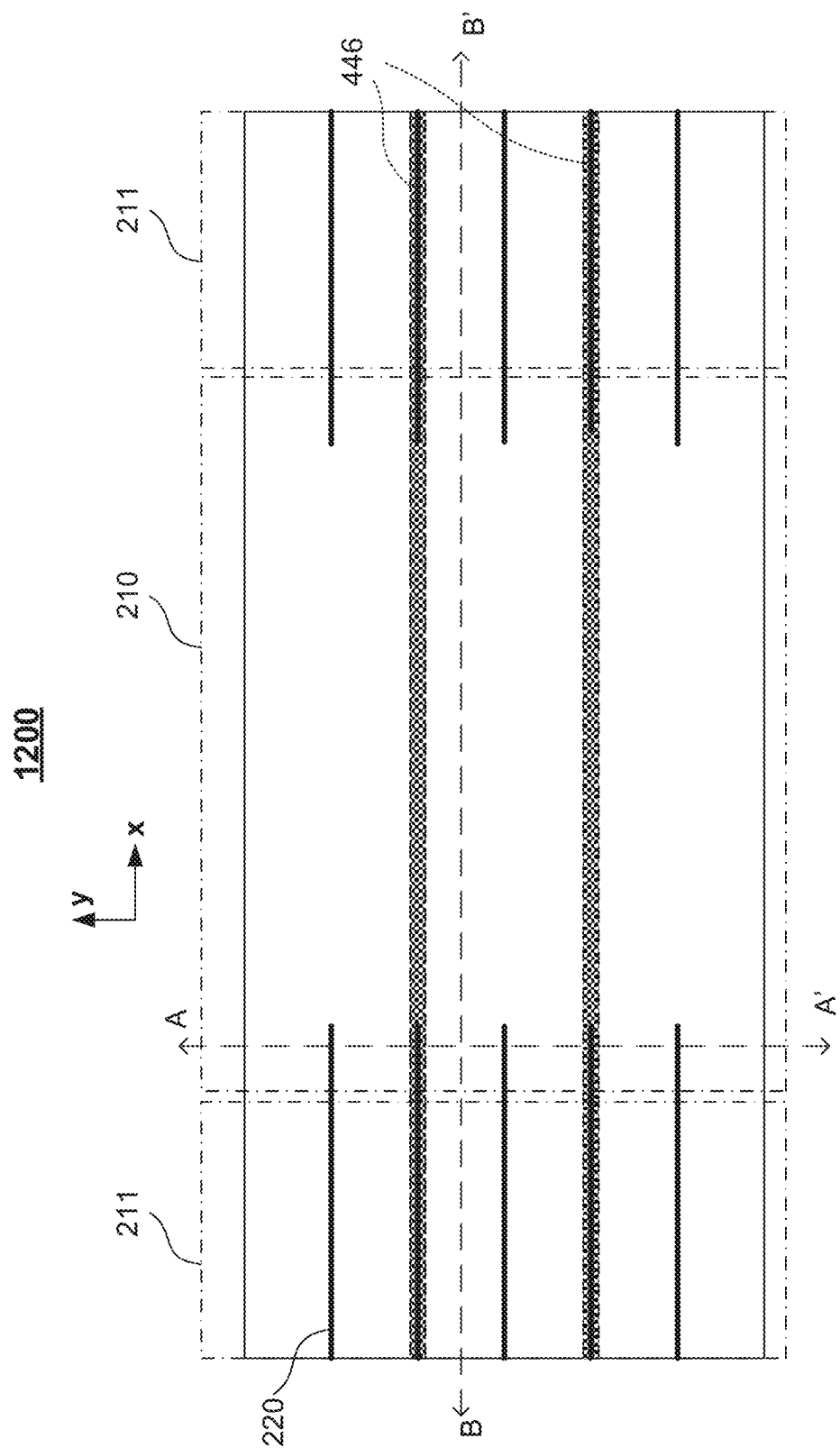
FIG. 12B illustrates a top-down view of the 3D memory structure in FIG. 12A, according to some embodiments of the present disclosure.

At process step S930, a top select gate (TSG) cut 220 can be formed in an upper portion of the alternating dielectric stack 1164. FIG. 12A illustrates a cross-sectional view of an exemplary structure 1200 along y-direction, according to some embodiments of the present disclosure. FIG. 12B illustrates a top down view of the structure 1200, where the cross-section in FIG. 12A is along line AA' in FIG. 12B. In some embodiments, one or more TSG cuts 220 can extend vertically through one or more dielectric layer pairs 1066. The TSG cuts 220 can extend laterally in x-direction with a width $t_2$ ranging from 50 nm to 500 nm. Forming the TSG cuts 220 includes, but not limited to, forming one or more trenches in the one or more dielectric layer pairs 1066 in the upper portion of the alternating dielectric stack 1164, and filling the one or more trenches with insulating materials such as silicon oxide, silicon nitride, silicon oxynitride, SiOCN, or any combination thereof. In some embodiments, forming the TSG cuts 220 further includes forming a co-planar surface using chemical mechanical polishing (CMP).

Figure 13A:
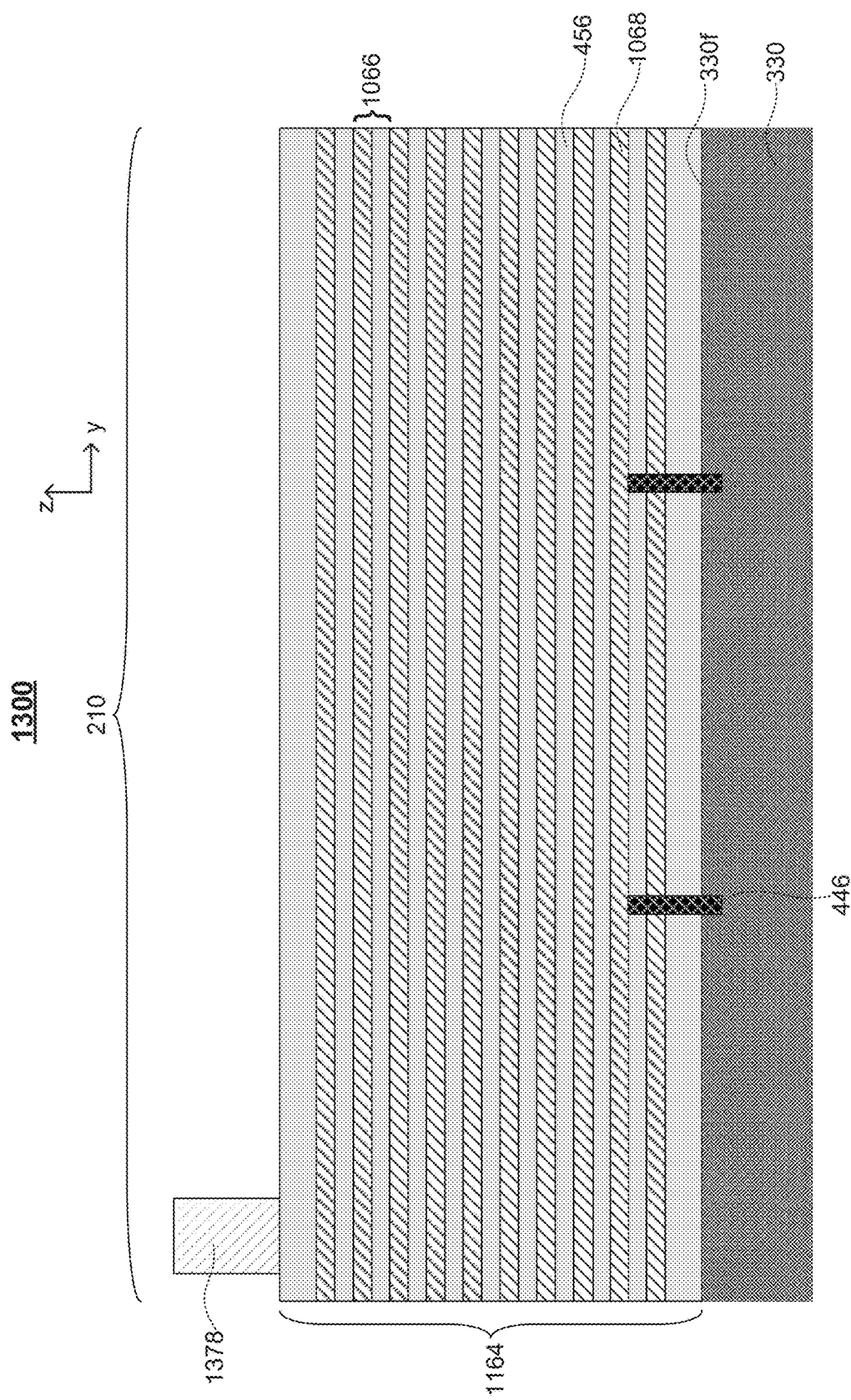
FIG. 13A illustrates a cross-sectional view a 3D memory structure at certain process step, according to some embodiments of the present disclosure.
Figure 13B:
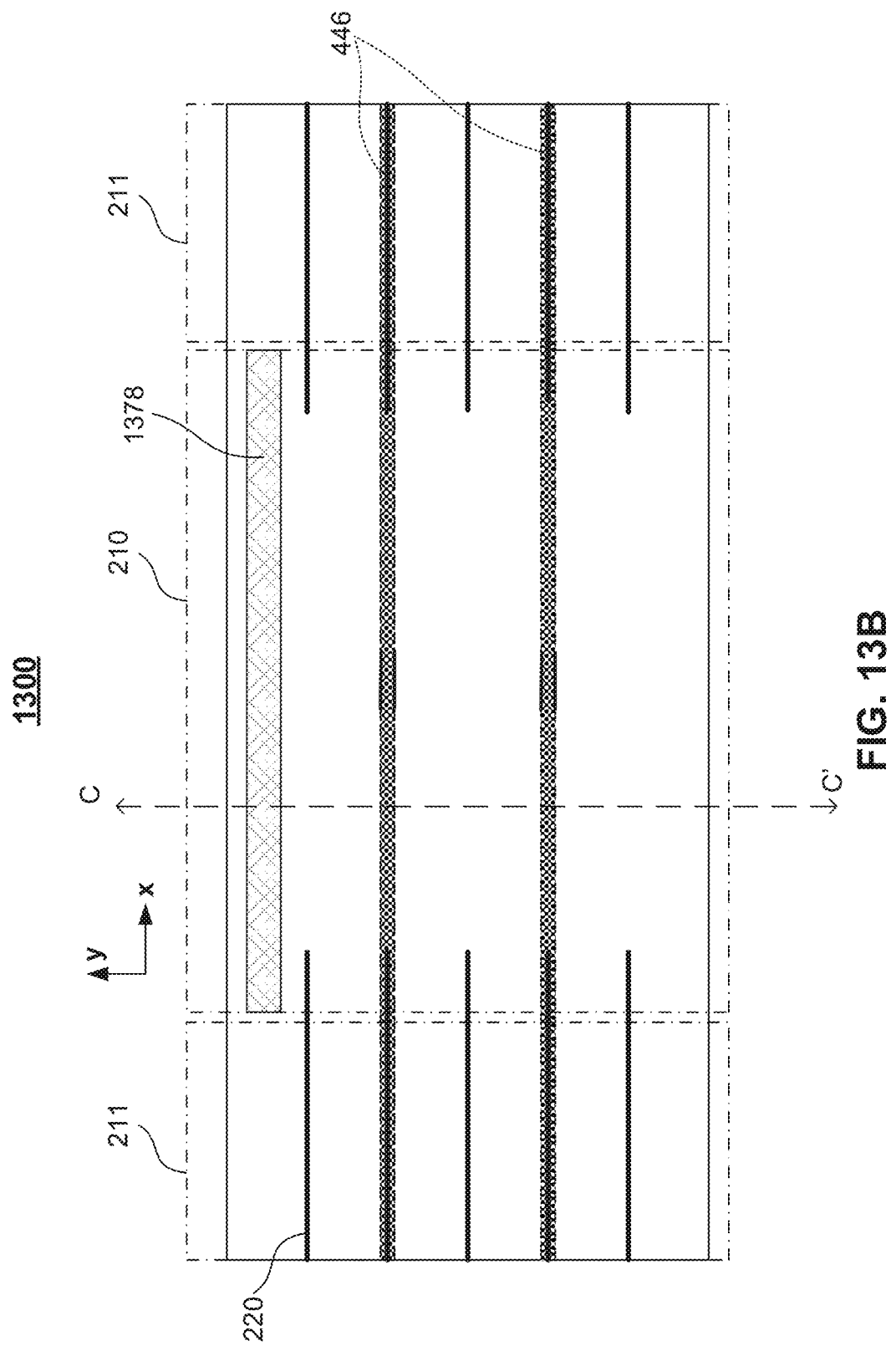
FIG. 13B illustrates a top-down view of the 3D memory structure in FIG. 13A, according to some embodiments of the present disclosure.

At process step S940, a hard mask 1378 can be disposed on the alternating dielectric stack 1164. FIG. 13A illustrates a cross-sectional view of an exemplary structure 1300 at process step S940, where a top-down view of the structure 1300 is illustrated in FIG. 13B. The cross-sectional view in FIG. 13A is in y-direction along line CC'.

In some embodiments, the hard mask 1378 can include dielectric materials such as silicon oxide, silicon oxynitride, silicon nitride, TEOS, silicon-containing anti-reflective coating (SiARC), amorphous silicon, polycrystalline silicon, high-k dielectric materials, or any combination thereof. The hard mask 1378 can be used to form the staircase bridge in the subsequent steps. The hard mask 1378 can define a width and a length of the staircase bridge. The hard mask 1378 can include a thickness large enough to protect the underlying alternating dielectric stack 1164 during the subsequent etching processes. The hard mask 1378 can be disposed on the alternating dielectric stack 1164 by using CVD, ALD, PVD, thermal oxidation or nitridation, evaporating, sputter, spin-coating, or any suitable thin film deposition process. The hard mask can then be patterned using a photolithography process and an etching process such as reactive-ion-etching (ME).

Figure 14A:
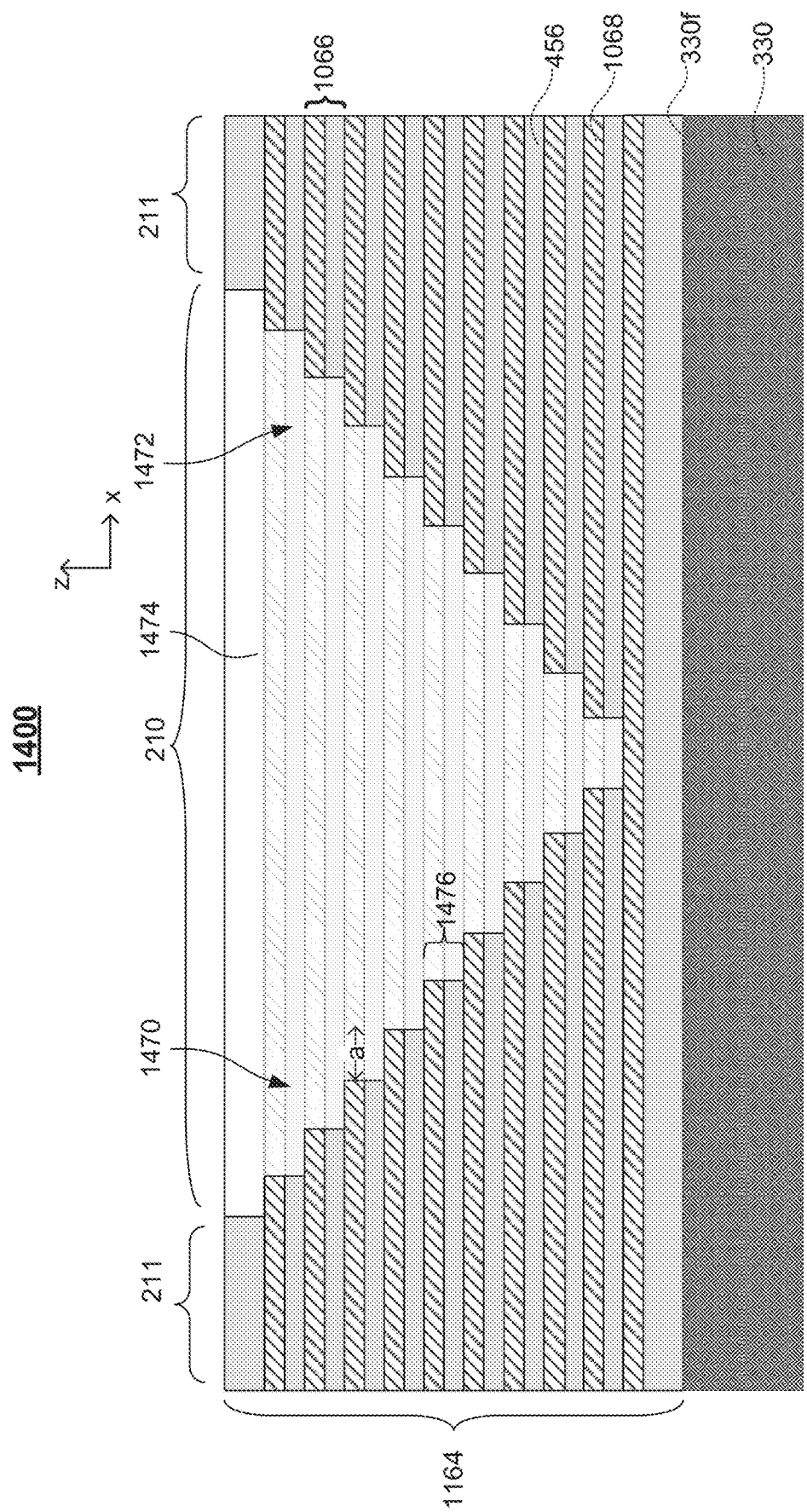
FIGS. 14A and 14B illustrate cross-sectional views a 3D memory structure at certain process step, according to some embodiments of the present disclosure.
Figure 14B:
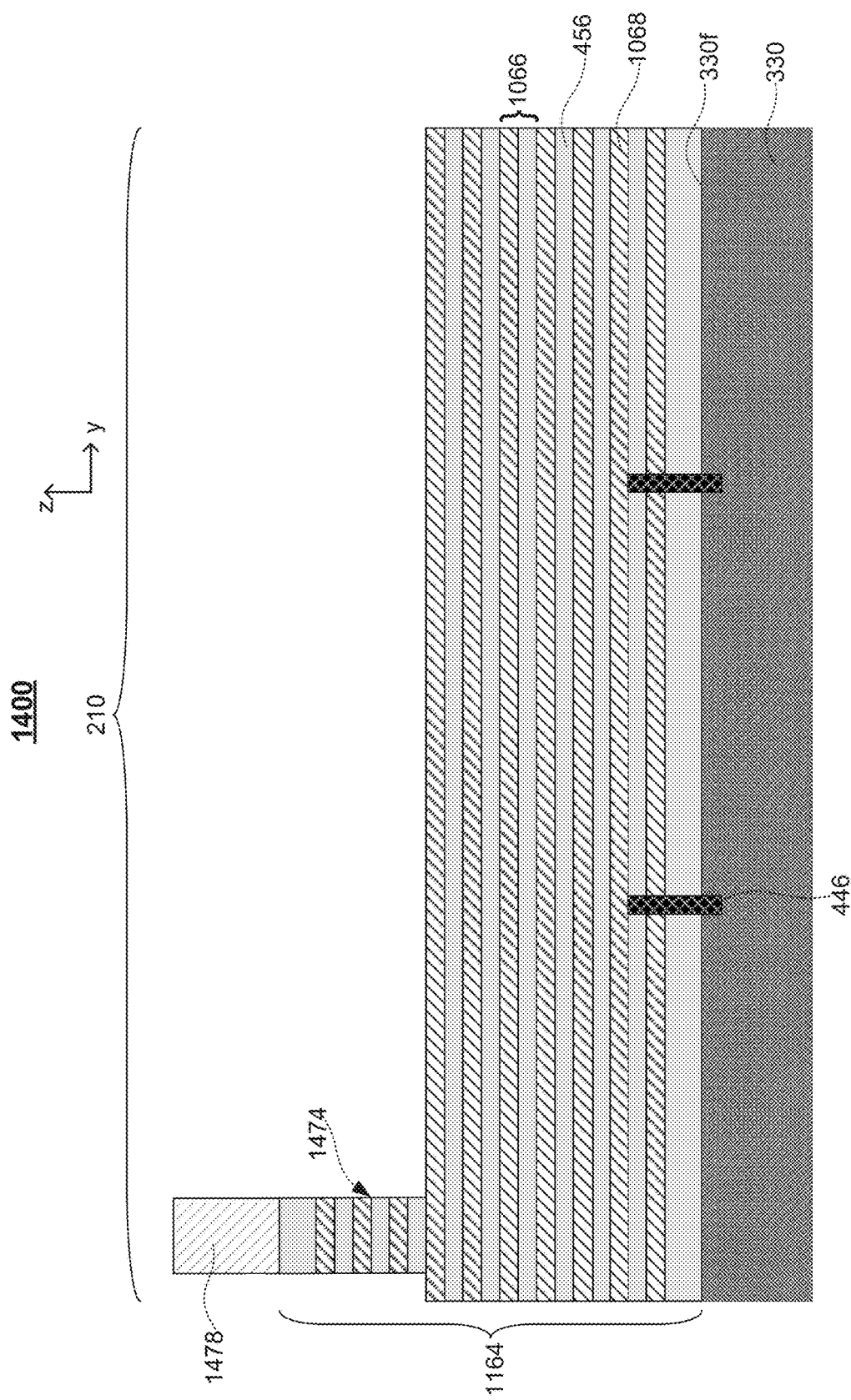
Figure 14C:
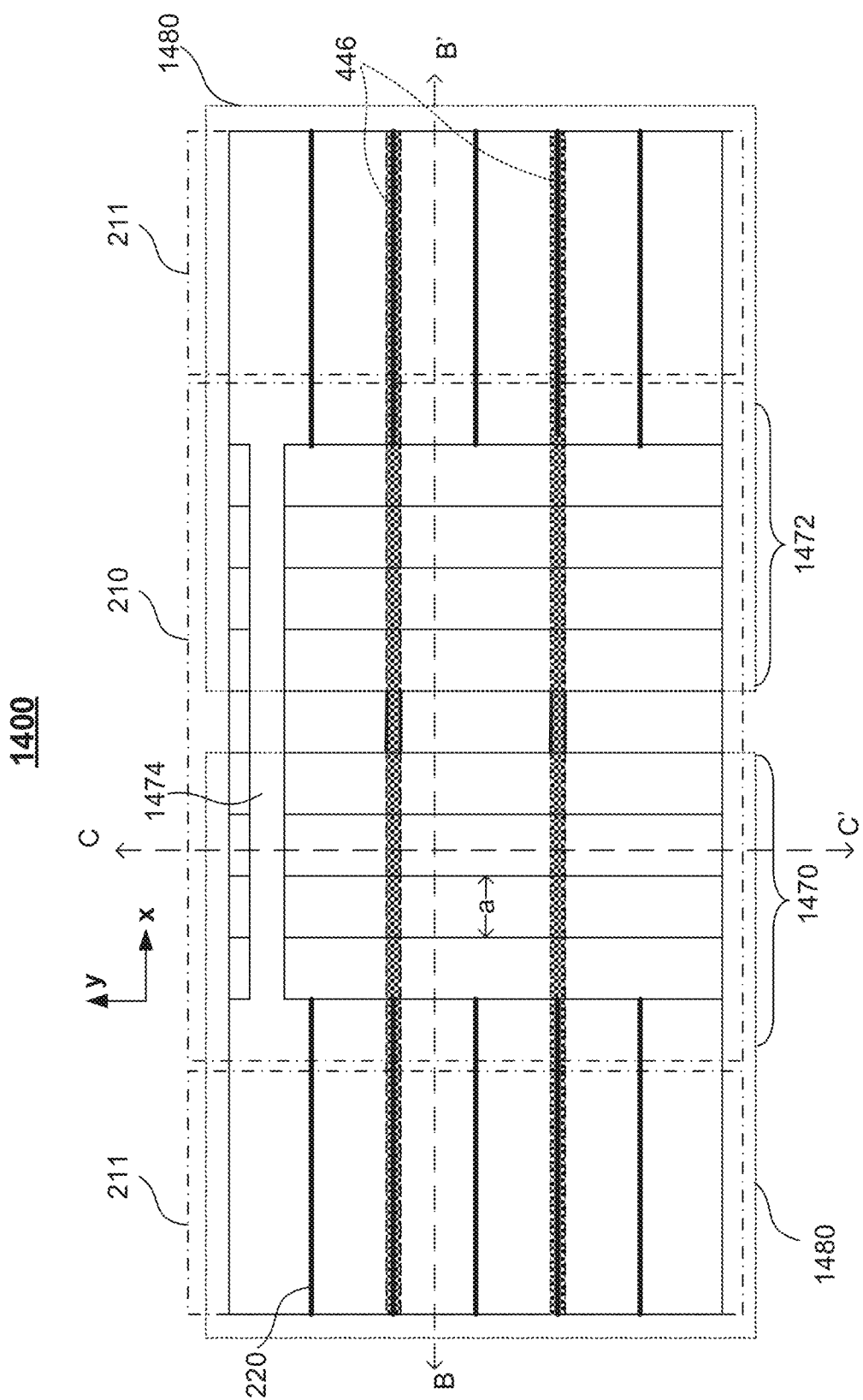
FIG. 14C illustrates a top-down view of the 3D memory structure in FIGS. 14A and 14B, according to some embodiments of the present disclosure.

At process step S950, a first dielectric staircase 1470 and a second dielectric staircase 1472 can be formed in the staircase region 210, where the first and second dielectric staircases can be connected by a dielectric bridge 1474. FIGS. 14A and 14B illustrate cross-sectional views of an exemplary structure 1400 along x- and y-directions, respectively, according to some embodiments of the present disclosure. FIG. 14C illustrates a top down view of the structure 1400, where the cross-sections in FIGS. 14A and 14B are along line BB' and line CC'. In some embodiments, the staircase region 210 can be disposed in the middle of the alternating dielectric stack 1164.

In the first and second dielectric staircases 1470 and 1472, a staircase step 1476, or a "staircase layer", refers to a layer stack with the same lateral dimension in a surface parallel to the substrate surface 330f. Each staircase step 1476 terminates at a shorter length than the staircase step underneath, with a lateral dimension "a" shown in FIG. 14A. In some embodiments, each staircase step 1476 includes one dielectric layer pair 1066. In some embodiments, each staircase step 1476 can include two or more dielectric layer pairs 1066.

The first and second dielectric staircases 1470 and 1472 can be formed by applying a repetitive etch-trim process on the alternating dielectric stack 1164 using a patterning mask 1480 (see FIG. 14C). In some embodiments, the patterning mask 1480 can include a photoresist or carbon-based polymer material. In some embodiments, the patterning mask 1480 can also include a hard mask, such as silicon oxide, silicon nitride, TEOS, silicon-containing anti-reflective coating (SiARC), amorphous silicon, polycrystalline silicon, or any combination thereof.

The etch-trim process includes an etching process and a trimming process. During the etching process, a portion of each staircase step 1476 with exposed surface can be removed. The remaining portion of each staircase step 1476, either covered by upper levels of staircase steps or covered by the patterning mask, is not etched. The etch depth is a thickness of the staircase step 1476. In some embodiments, the thickness of the staircase step 1476 is a thickness of one dielectric layer pair 1066. The etching process for the dielectric layer 456 can have a high selectivity over the sacrificial layer 1068, and/or vice versa. Accordingly, an underlying dielectric layer pair 1066 can function as an etch-stop layer. By switching etching process for each layer, the staircase step 1476 can be etched during one etching cycle. And as a result, one staircase step 1476 is formed during each etch-trim cycle.

In some embodiments, the staircase step 1476 can be etched using an anisotropic etching such as a reactive ion etch (RIE) or other dry etch processes. In some embodiments, the dielectric layer 456 is silicon oxide. In this example, the etching of silicon oxide can include RIE using fluorine based gases, for example, carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed etching approach can be used. In some embodiments, the sacrificial layer 1068 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer stack should not be limited by the embodiments of the present disclosure.

The trimming process includes applying a suitable etching process (e.g., an isotropic dry etch or a wet etch) on the patterning mask such that the patterning mask can be pulled back laterally. The lateral pull-back dimension determines the lateral dimension "a" of each step of the first and second dielectric staircases 1470 and 1472. After patterning mask trimming, one portion of the topmost staircase step 1476 is exposed and the other portion of the topmost staircase step 1476 remains covered by the patterning mask. The next cycle of etch-trim process resumes with the etching process.

In some embodiments, the patterning mask trimming process can include dry etching, such as RIE using $O_2$, Ar, $N_2$, etc.

In some embodiments, the topmost staircase step 1476 can be covered by the dielectric layer 456. In some embodiments, the topmost staircase step 1476 can further be covered by other dielectric materials. A process step of removing the dielectric layer 456 and/or the other dielectric materials can be added to the etching process of each etch-trim cycle to form the first and second dielectric staircases 1470 and 1472.

In some embodiments, the dielectric bridge 1474 can be formed simultaneously as the first and second dielectric staircases 1470 and 1472, where the dielectric bridge 1474 can be defined by the hard mask 1378. During the etch-trim process, a portion of the alternating dielectric stack 1164 below the hard mask 1378 can be protected and is not etched. As a result, the dielectric layer 456 and the sacrificial layer 1068 in the first and second dielectric staircases 1470 and 1472 can be connected through the dielectric bridge 1474 for each staircase step 1476.

In some embodiments, the hard mask 1378 and the patterning mask for the etch-trim process can be removed after the process step S950.

Figure 15A:
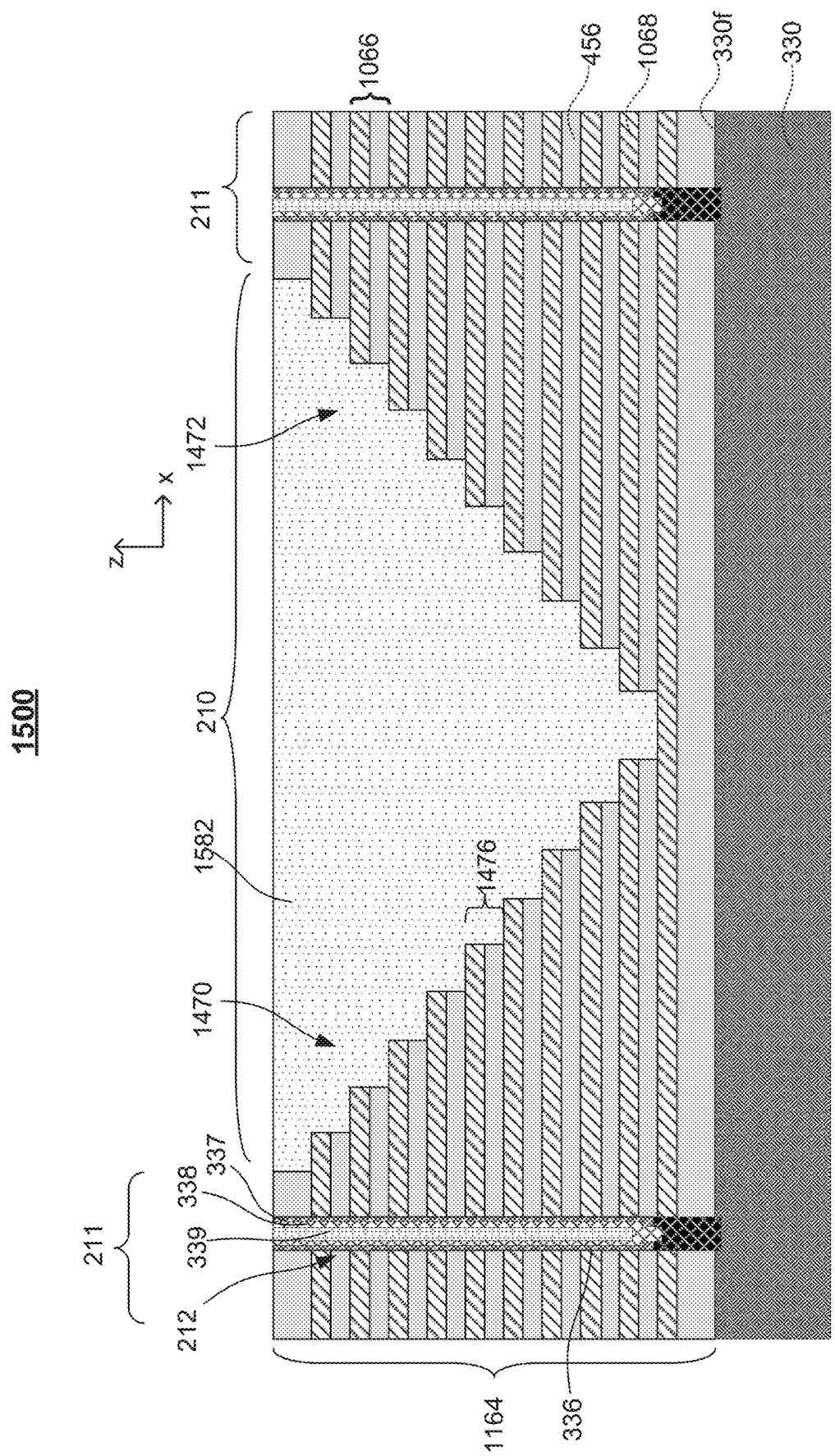
FIG. 15A illustrates a cross-sectional view a 3D memory structure at certain process step, according to some embodiments of the present disclosure.
Figure 15B:
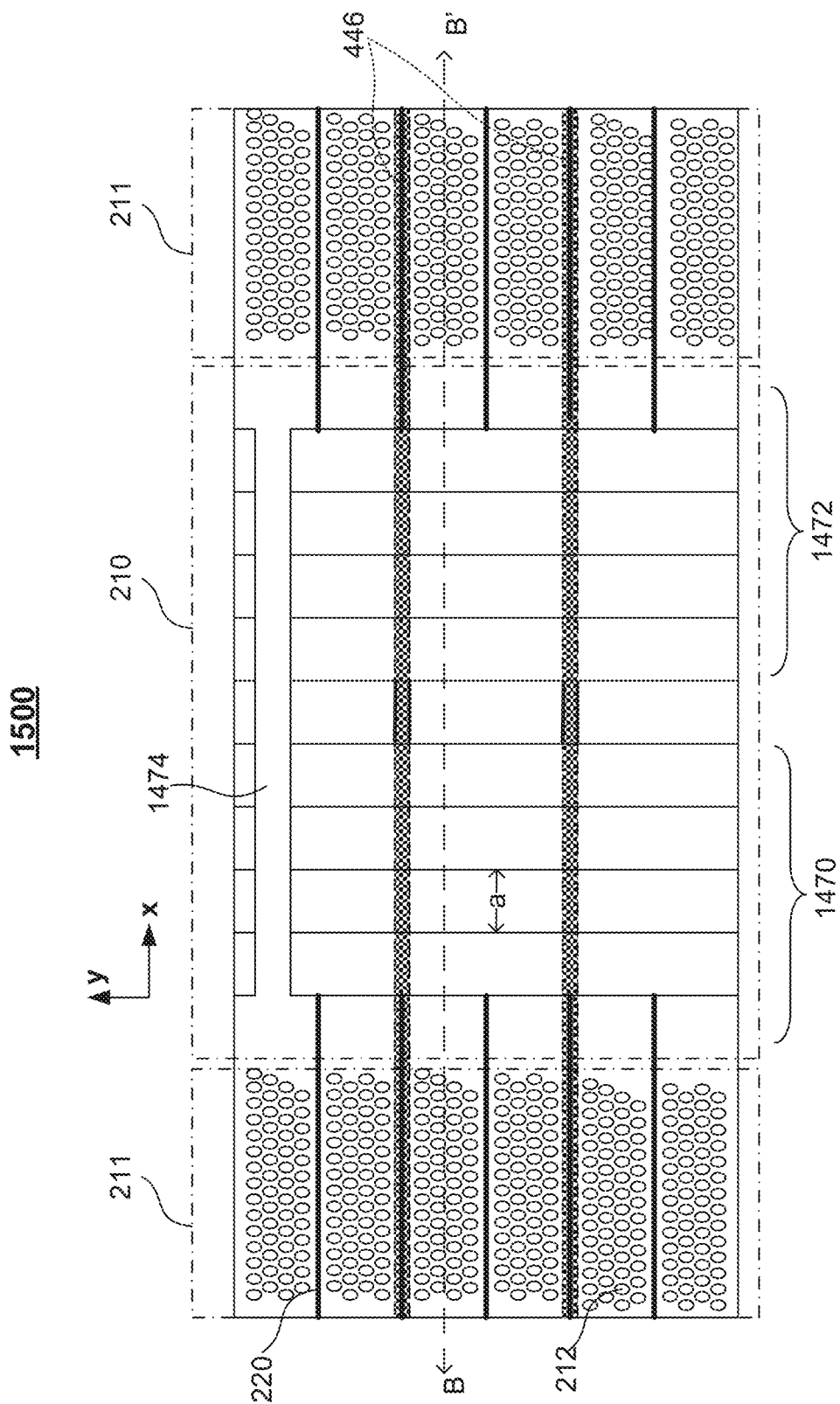
FIG. 15B illustrates a top-down view of the 3D memory structure in FIG. 15A, according to some embodiments of the present disclosure.

At process step S960, a plurality of memory strings 212 can be formed in the alternating dielectric stack 1164 in the channel structure region 211, according to some embodiments of the present disclosure. FIG. 15A illustrates a cross-sectional view of an exemplary structure 1500 at process step S960. FIG. 15B illustrates a top-down view of the structure 1500. The cross-sectional view in FIG. 15A is in x-direction along line BB'. The memory strings 212 are similar to the memory strings discussed previously with reference to FIGS. 3 and 4.

In some embodiments, priority to forming the plurality of memory strings 212, an insulating layer 1582 can be disposed over the first and second dielectric staircases 1470 and 1472. The insulating layer 1582 can include any suitable insulator, for example, spin-on-glass, silicon oxide, low-k dielectric material such as carbon-doped oxide (CDO or SiOC or SiOC:H), or fluorine doped oxide (SiOF), etc. The insulating layer 1582 can be disposed by CVD, PVD, sputtering, spin-coating, etc. In some embodiments, a planarization process, for example RIE etch-back or chemical mechanical polishing (CMP), can be performed to form a coplanar surface, parallel to the surface 330f of the substrate 330.

To form the plurality of memory strings 212, a plurality of channel holes (e.g., the channel holes 336) can be formed first in the alternating dielectric stack 1164, penetrating the entire alternating dielectric stack 1164 and extending into the substrate 330.

After forming the channel holes 336, the memory film 337 can be disposed on a sidewall of each channel hole 336. In some embodiments, the memory film 337 can be a composite layer including a tunneling layer, a storage layer (also known as "charge trap/storage layer"), and a blocking layer. Next, a channel layer 338 and a core filling film 339 can be disposed inside the channel holes 336. The channel layer 338 covers a sidewall of the memory film 337 inside the channel hole 336. The channel layer 338 can be any suitable semiconductor material such as silicon. The core filling film 339 can be any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof.

In some embodiments, dummy memory strings (e.g., the dummy memory strings 222 in FIG. 2) can also be formed in the alternating dielectric stack 1164, adjacent to the memory strings 212 and/or in the staircase regions. While the memory strings 212 can be used for memory storage, dummy memory strings 222 can be used to provide structural support and improve process uniformity during manufacturing. In some embodiments, the dummy memory strings 222 can also include the core filling film 339 and can be formed using similar techniques as the memory strings 212.

Figure 16:
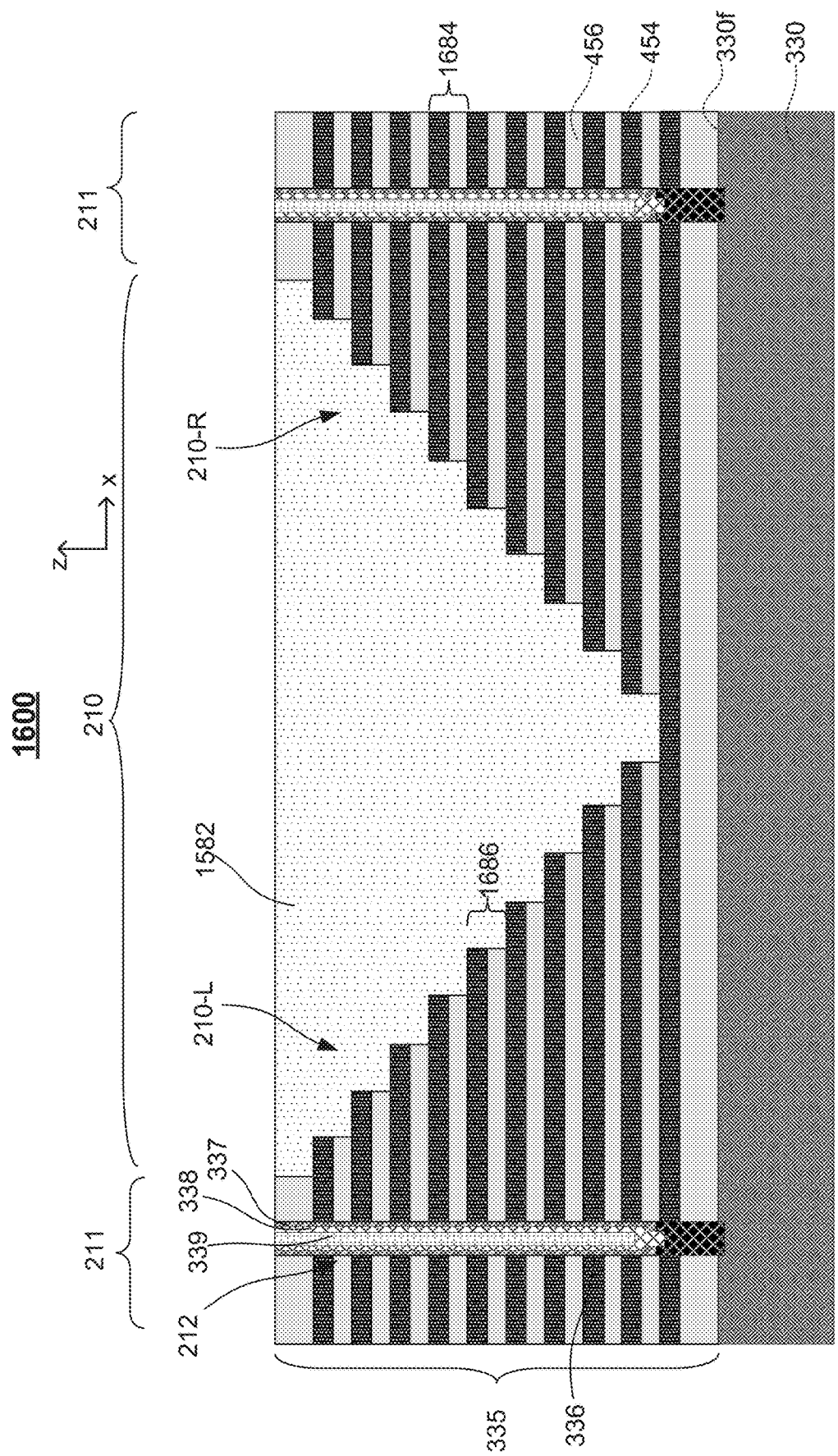
FIG. 16 illustrates a cross-sectional view a 3D memory structure at certain process step, according to some embodiments of the present disclosure.

At process step S970, a film stack 335 of alternating conductive and dielectric layers can be formed by replacing the sacrificial layers 1068 in the alternating dielectric stack 1164 in FIG. 15A with conductive layers 454. FIG. 16 illustrates a cross-sectional view of an exemplary structure 1600, according to some embodiments of the present disclosure. The film stack 335 is similar to the film stack previously discussed with reference to FIGS. 3 and 4. After replacing the sacrificial layers with conductive layers, staircase structures 210-L and 210-R can be formed in the staircase region 210.

The film stack 335 of alternating conductive and dielectric layers includes conductive layers 454 sandwiched between the dielectric layers 456. In structure 1600, each staircase step 1686 includes a conductive and dielectric layer pair 1684. In some embodiments, each staircase step 1686 can include two or more conductive and dielectric layer pairs, each conductive and dielectric layer pair having one conductive layer 454 and one dielectric layer 456.

To form the staircase structures 210-L and 210-R, the sacrificial layer 1068 in the alternating dielectric stack 1164 in FIG. 15A can be removed selectively over the dielectric layers 456 to form a plurality of horizontal tunnels. The selective etching of the sacrificial layer 1068 can include wet or dry chemical etching. Then, the conductive layer 454 can be disposed in the horizontal tunnels.

The conductive layer 454 can include any suitable conductive material that is suitable for a gate electrode, e.g., tungsten (W), aluminum (Al), copper (Cu), cobalt (Co), titanium (Ti), tantalum (Ta), titanium nitride (TiN), tantalum nitride (TaN), and/or any combination thereof. The conductive material can be disposed by CVD, PVD, ALD, sputtering, evaporation, etc. In some embodiments, the conductive layer 454 can also be poly-crystalline semiconductors, such as poly-crystalline silicon, poly-crystalline germanium, poly-crystalline germanium-silicon, and/or combinations thereof. In some embodiments, the poly-crystalline material can be incorporated with any suitable types of dopant, such as boron, phosphorous, or arsenic. In some embodiments, the conductive layer 454 can also be amorphous semiconductors.

In some embodiments, a gate dielectric layer can be disposed in the horizontal tunnels prior to the conductive layer 454 to reduce leakage current between adjacent word lines (gate electrodes) and/or to reduce leakage current between gate and channel. The gate dielectric layer can include silicon oxide, silicon nitride, silicon oxynitride, and/or any suitable combinations thereof. The gate dielectric layer can also include high-k dielectric materials, such as hafnium oxide, zirconium oxide, aluminum oxide, tantalum oxide, lanthanum oxide, and/or any combination thereof. The gate dielectric layer can be disposed by one or more suitable deposition processes, such as CVD, PVD, and/or ALD.

The conductive layers 454 function as gate electrodes at the intersection with memory strings 212. It is noted that the number of memory strings and gate electrodes in FIG. 16 are shown for illustrative purposes, and can be any suitable number to increase storage capacity.

Figure 17A:
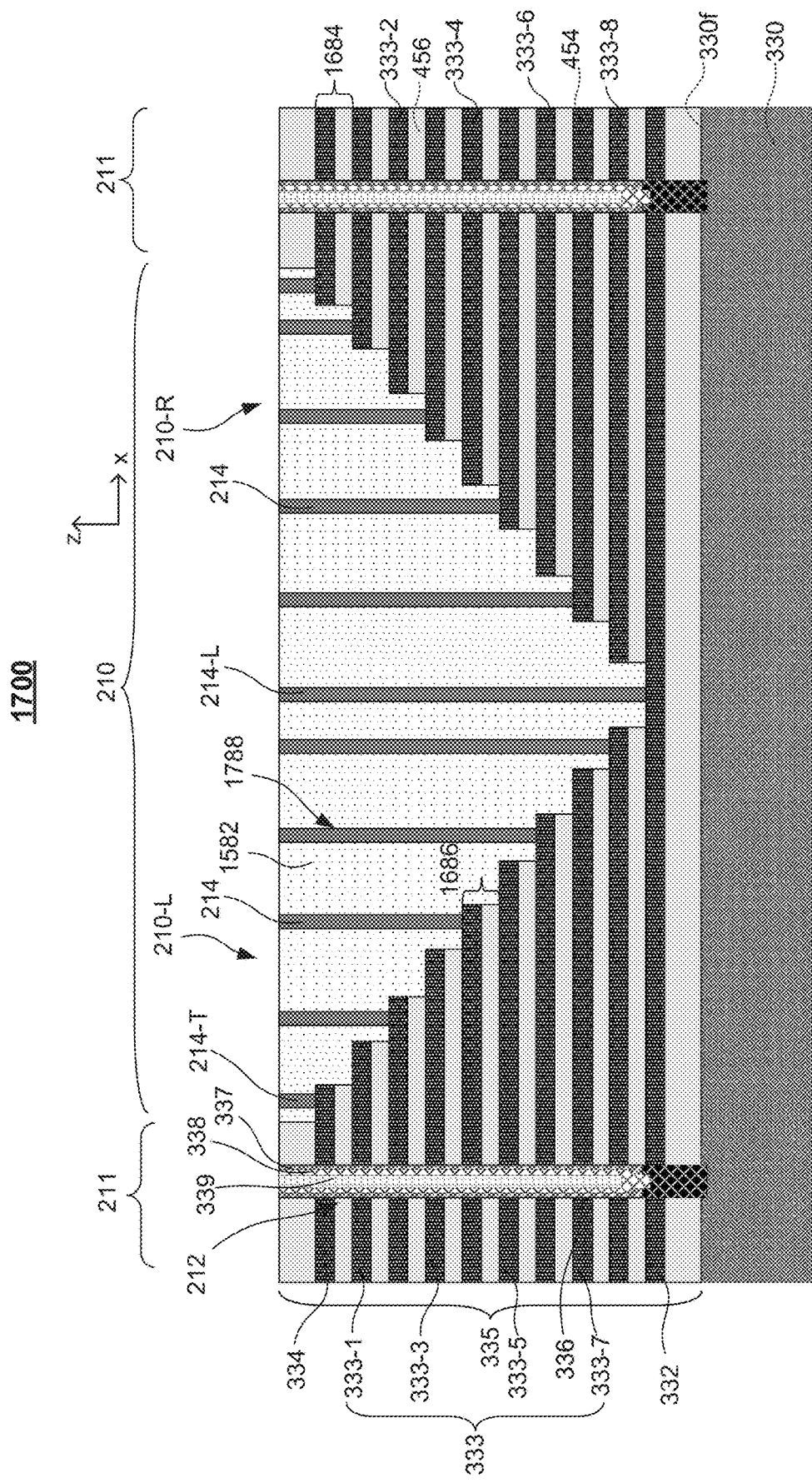
FIG. 17A illustrates a cross-sectional view a 3D memory structure at certain process step, according to some embodiments of the present disclosure.
Figure 17B:
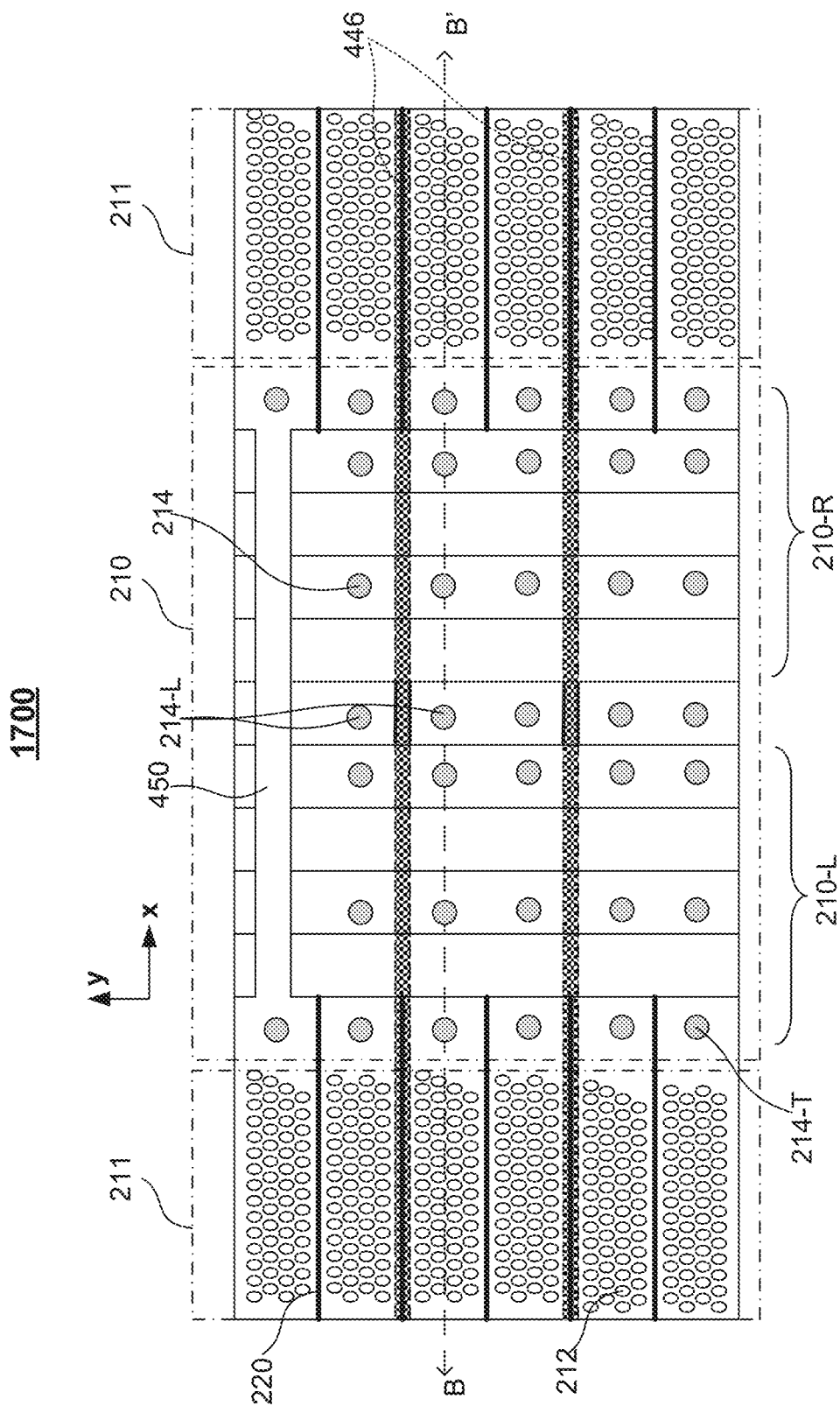
FIG. 17B illustrates a top-down view of the 3D memory structure in FIG. 17A, according to some embodiments of the present disclosure.

At process step S980, contact structures 214 can be formed on the staircase structures 210-L and 210-R. FIG. 17A illustrates a cross-sectional view of an exemplary structure 1700 at process step S980. FIG. 17B illustrates a top-down view of the structure 1700. The cross-sectional view in FIG. 17A is in x-direction along line BB'. The contact structures 214 can be similar to the contact structures discussed previously with reference to FIGS. 2-4.

Forming contact structures 214 includes forming a plurality of contact holes through the insulating layer 1582 and disposing conductive material in the plurality of contact holes.

In some embodiments, photoresist or polymer material can be used as a mask layer to etch the contact holes 1788. One or more masks and patterning processes can be used to form the contact holes 1788. In some embodiments, the insulating layer 1582 can include an etch-stop layer (not shown) that protects the underlying structure until all the contact holes 1788 are formed on each staircase step 1686. The contact holes 1788 extend through the insulating layer 1582, exposing the conductive layers 454.

The contact structures 214 can be formed by disposing a conductive material in the contact holes 1788. In some embodiments, the contact structures 214 can include a metal or metallic compound, such as tungsten, cobalt, nickel, copper, aluminum, titanium, tantalum, tantalum nitride (TaN), and/or any combination thereof. The metal or metallic compound can be formed by any suitable deposition methods, for example, sputtering, thermal evaporation, e-beam evaporation, ALD, PVD, and/or any combination thereof. In some embodiments, the contact structures 214 can also include a metal silicide, including $WSi_x$, $CoSi_x$, $NiSi_x$, or $AlSi_x$, etc.

In some embodiments, the contact structures 214 can be coplanar with the insulating layer 1582 using a planarization process, for example, a CMP process.

Through the contact structures 214, the electrical conductive path for the vertically stacked conductive layers 454 can be wired up to the surface, enabling various interconnects for the 3D memory device in the back-end-of-line process.

In some embodiments, the contact structures 214-T and 214-L can be formed on the gate electrodes for the top select gate (TSG) 334 and lower select gate (LSG) or bottom select gate (BSG) 332, respectively. In some embodiments, one or more contact structures 214 can be formed on the same TSG 334, word line 333 and BSG 332.

After replacing the sacrificial layers 1068 with the conductive layers 454, the dielectric bridge 1474 in FIG. 15B can be converted to the staircase bridge 450 in FIG. 17B. As a result, the conductive layers 454 of the staircase structures 210-L and 210-R can be connected through the staircase bridge 450. Therefore, each word line 333 can be electrically connected either from the staircase structure 210-L or the staircase structure 210-R. In some embodiments, the contact structures 214 can be formed on the odd number of word lines 333 in staircase structures 210-L and even number of word lines 333 in staircase structures 210-R. In this configuration, spacing of contact structures at adjacent staircase step 1686 can be increased.

In summary, the present disclosure describes various embodiments of a 3D memory device and methods of making the same.

One aspect of the present disclosure provides a three-dimensional (3D) memory device. In an example, the 3D memory device includes a film stack having a plurality of conductive and dielectric layer pairs vertically stacked on a substrate. Each conductive and dielectric layer pair includes a dielectric layer and a conductive layer. The 3D memory device also includes a staircase region having a first and a second staircase structure formed in the film stack, where the first and second staircase structures each extends laterally in a first direction and includes the plurality of conductive and dielectric layer pairs. The staircase region further includes a staircase bridge connecting the first and second staircase structures.

Another aspect of the disclosure provides a method for forming a three-dimensional (3D) memory device. The method includes disposing an alternating dielectric stack on a substrate, where the alternating dielectric stack includes a plurality of dielectric layer pairs. Each dielectric layer pair includes a first dielectric layer and a second dielectric layer different from the first dielectric layer. The method also includes forming a first dielectric staircase, a second dielectric staircase, and a dielectric bridge in the alternating dielectric stack, where the first and second dielectric staircases are connected by the dielectric bridge.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a film stack, comprising a plurality of conductive and dielectric layer pairs vertically stacked on a substrate, wherein each conductive and dielectric layer pair comprises a dielectric layer and a conductive layer;
   bottom select gate cuts penetrating vertically through one or more of the conductive and dielectric layer pairs at a bottom portion of the film stack and extending laterally in a first direction; and
   a first staircase region, comprising:
      a first staircase structure formed in the film stack;
      a second staircase structure formed in the film stack, wherein the first and second staircase structures each extends laterally in the first direction and comprises the plurality of conductive and dielectric layer pairs; and
      a staircase bridge extending laterally in the first direction and connecting the first and second staircase structures, wherein, in a second direction perpendicular to the first direction, the staircase bridge comprises a width smaller than a distance between adjacent bottom select gate cuts.

2. The 3D memory device of claim 1, wherein the staircase bridge comprises the plurality of conductive and dielectric layer pairs.

3. The 3D memory device of claim 2, wherein the staircase bridge is configured to electrically connect the conductive layer in each conductive and dielectric layer pair of the first staircase structure with the conductive layer in a corresponding conductive and dielectric layer pair of the second staircase structure.

4. The 3D memory device of claim 1, wherein in the second direction, the width of the staircase bridge is smaller than a width of the first and second staircase structures.

5. The 3D memory device of claim 1, wherein, in the first direction, an upper portion of the staircase bridge is longer than a lower portion of the staircase bridge.

6. The 3D memory device of claim 1, further comprising:
   a plurality of memory strings vertically penetrating through the film stack, the plurality of memory strings each comprising:
      a core filling film;
      a channel layer surrounding the core filling film; and
      a memory film surrounding the channel layer.

7. The 3D memory device of claim 6, wherein the plurality of memory strings are distributed on opposite sides of the first staircase region.

8. The 3D memory device of claim 1, wherein the first and second staircase structures are symmetric to each other along the second direction.

9. The 3D memory device of claim 1, further comprising:
a plurality of contact structures, electrically connected with the conductive layers of the first and second staircase structures.

10. The 3D memory device of claim 9, wherein
a first subset of the plurality of contact structures is formed on the conductive layers of the first staircase structure; and
a second subset of the plurality of contact structures is formed on the conductive layers of the second staircase structure, wherein the second subset of the plurality of contact structures is different from the first subset of the plurality of contact structures.

11. The 3D memory device of claim 1, wherein the first staircase region is in a center of a memory array of the 3D memory device.

12. The 3D memory device of claim 1, wherein the bottom select gate (BSG) cuts are configured to divide a memory array into two or more sub-blocks, each sub-block comprising a sub-BSG.

13. The 3D memory device of claim 1, further comprising:
a second staircase region, comprising:
a third staircase structure and a fourth staircase structure formed in the film stack, wherein the third and fourth staircase structures extend laterally in the first direction; and
a second staircase bridge connecting the third and the fourth staircase structures, wherein the first and the second staircase bridges are on opposite sides of the first and second staircase regions, respectively.

14. The 3D memory device of claim 1, wherein the bottom select gate cuts comprise an insulating material.

15. The 3D memory device of claim 1, further comprising:
a top select gate cut extending vertically through one or more of the conductive and dielectric layer pairs at an upper portion of the film stack.

16. The 3D memory device of claim 15, wherein the top select gate cut extends laterally in the first direction and comprises an insulating material.

* * * * *